United States Patent [19]

Okaniwa et al.

[11] 4,241,172
[45] Dec. 23, 1980

[54] LIGHT-SENSITIVE SILVER HALIDE COLOR PHOTOGRAPHIC MATERIAL

[75] Inventors: Kenichiro Okaniwa; Takashi Uchida; Morio Kobayashi; Hiroshi Sugita; Takashi Sasaki, all of Hino, Japan

[73] Assignee: Konishiroku Photo Industry Co., Ltd., Tokyo, Japan

[21] Appl. No.: 42,084

[22] Filed: May 24, 1979

[30] Foreign Application Priority Data

Jun. 1, 1978 [JP] Japan .................................. 53/66199

[51] Int. Cl.³ .............................................. G03C 1/40
[52] U.S. Cl. ..................... 430/548; 430/552; 430/553; 430/554; 430/555; 430/556; 430/557
[58] Field of Search .................. 96/100; 430/381, 384, 430/385, 386, 387, 388, 389, 548, 552-558

[56] References Cited
U.S. PATENT DOCUMENTS

| | | | |
|---|---|---|---|
| 3,615,604 | 10/1971 | Kunitz et al. | 96/100 |
| 3,891,445 | 6/1975 | Arai et al. | 96/100 |
| 3,973,979 | 10/1976 | Meier et al. | 96/100 |

Primary Examiner—Mary F. Downey

Attorney, Agent, or Firm—Bierman & Bierman

[57] ABSTRACT

A silver halide color photographic material comprising a coupler represented by the following general formula:

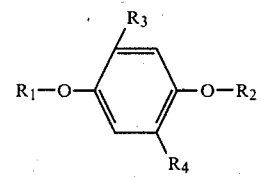

wherein
$R_1$, $R_2$, $R_3$ and $R_4$ individually represent a substituted or unsubstituted alkyl, alkenyl, aryl, cycloalkyl group, or,
$+(A-X)_n]_m$Cp in which Cp represents a cyan coupler, magenta coupler or yellow coupler, A represents a substituted or unsubstituted divalent aliphatic group, X represents a divalent group, and m and n individually represent a value of 0 or 1, provided that at least one of $R_1$, $R_2$, $R_3$ and $R_4$ is $+(A-X)_n]_m$Cp.

7 Claims, No Drawings

LIGHT-SENSITIVE SILVER HALIDE COLOR PHOTOGRAPHIC MATERIAL

This invention relates to a light-sensitive silver halide color photographic material containing a coupler and particularly to a light-sensitive silver halide color photographic material containing novel couplers capable of giving a dye image improved in stability against light.

Formation of color photographic images according to the subtractive color process is generally accomplished by subjecting after exposure a light-sensitive silver halide color photographic material (hereinafter called "color photosensitive material") in the presence of a cyan coupler, a magenta coupler and a yellow coupler to color development with a color developer containing an aromatic primary amine type developing agent. In that case, silver halide particles present in the exposed color photosensitive material are reduced with the developing agent and an oxidation product of the developing agent, which is formed simultaneously therewith, undergoes coupling reaction with the couplers to form a cyan dye, magenta dye and yellow dye, respectively, whereby a color photographic image is formed.

The couplers may individually be incorporated into either a color photosensitive material or a color developer. Generally, a color photosensitive material having incorporated therein these couplers is called an inner type color photographic material and, on the other hand, a color photosensitive material which is subjected to color development with a color developer having incorporated therein said couplers is called an outer type color photosensitive material.

The present invention is concerned with an inner type color photosensitive material having incorporated the couplers into its photosensitive constituents.

Usable as yellow couplers for forming yellow dyes are generally compounds having open chain active methylene groups, and usable as magenta couplers for forming magenta dyes are generally compounds having a pyrazolone, pyrazolinobenzimidazole, indazolone or pyrazolotriazole nucleus, each having a closed chain active methylene group. All of the compounds mentioned above forms an azomethine dye on color development. On the other hand, usable as cyan couplers for forming cyan dyes are generally phenol or $\alpha$-naphthol type compounds having phenolic hydroxy groups, and such compounds form indoaniline type dyes on color development.

It is a desideratum for dye images obtained on color development from the above-mentioned couplers that the images are not subject to discoloration or fading even when exposed to light for a prolonged period of time or stored under the circumstances or high temperature and humidity.

However, it is well known that the dye images referred to above are not yet found satisfactory in their stability to ultraviolet light or visible ray and are readily liable to discoloration or fading on irradiation of these actinic radiations. Furthermore, unreacted couplers remaining mainly in the unexposed area of an exposed color photosensitive material are also subject to chemical change due to actinic radiations and thereby to bring about the so-called yellow stain (hereinafter called "Y-stain"). Such discoloration or fading becomes a matter of grave concern to color photosensitive materials, particularly to the case of color image prints which are often exposed for a long period of time to the action of actinic radiations.

For overcoming such drawbacks as mentioned above, various proposals have heretofore been made. Such proposals include, for example, a process of incorporating an ultraviolet absorber of every kind into a color photographic material or a process of incorporating a fading preventive having a phenolic hydroxy group into a color photographic material. However, these improved process relying on the use of additives had their respective limits. For satisfactorily attaining the stability, for example, there was in need for adding a relatively large amount of the additive and there were often observed various disadvantages brought about thereby, such as coloration, increase in film thickness, degradation in sharpness, etc.

On the one hand, there have heretofore been made not only the proposals for improvement relying on the use of additives but also such proposals for improving stability against light by a variety of selections of structures of the couplers, per se. For instance, there have been proposed couplers containing o-hydroxyphenylbenztriazole nucleus, which is an ultraviolet absorbing group, in the coupler molecule, or pyrazolone type magenta couplers and phenol type cyan couplers having phenolic hydroxy groups as stabilizing groups.

In the couplers having the ultraviolet absorbing group, however, there is obtained no preventive effect on fading due to visible light, though they are found effective for ultraviolet absorbing purposes. In the couplers having the stabilizing group, on the one hand, because of having the phenolic hydroxy group, they were not found sufficiently stable upon processing by such high alkali solution as a color developer and often brought about undesirable side reactions.

Furthermore, in the case of couplers into which the aforesaid ultraviolet absorbing group or phenolic stabilizing group has been introduced, there was in need for the preparation thereof a complicated process, and these couplers were involved in a grave problem from the practical viewpoint.

In addition thereto, there have been proposed such couplers as having an unsubstituted or monoalkyl-substituted hydroquinonediether group which is used as a group capable of imparting stability against light to the resulting dyes. The dyes obtained from such couplers, as compared with the prior couplers, certainly had an improved the stability, but the extent of improvement achieved thereby was not satisfied with all concerned, particularly in the case of storage for a long time. These couplers, including the foregoing ones, were not found yet to the satisfaction of all concerned in respect of a desired sufficient fading-inhibition effect.

Properties required for the photographic couplers are such that not only they are excellent in stability of the resulting dyes but also their ability of formation of dyes by processing, stability in organic solvents, and dispersion stability in silver halide emulsions are favorable, and further that they have their light absorption wavelength regions within desirable range and favorable silver halide emulsion characteristics.

With respect to prevention of the fading of dye images, which has posed a problem in recent years in the art concerned, furthermore, a desideratum for a photographic coupler is that the couplers have a fading inhibition effect which particularly lasts over a long period of time, and further that they must have sufficiently resistance to various oxidizing agents and reducing agents and are stable particularly to visible light or various oxidative species derived by the action of visible light.

An object of the present invention is to provide a color photosensitive material containing couplers capable of meeting the aforesaid various characteristics required for the photographic couplers and particularly having excellent and long-lasting stability against light.

Another object of the present invention is to provide a color photosensitive material containing couplers capable of giving dye images improved in its long-lasting stability to visible light as well as to various oxidative species derived by the action of visible light.

Further object is to provide new couplers in accordance with the above-mentioned objects.

The present inventor's researches in the field of photographic couplers have resulted in the finding that the above-mentioned objects can be accomplished by incorporating into a color photosensitive material at least one of the compounds (hereinafter called "present couplers") represented by the following general formula [I].

General formula [I]

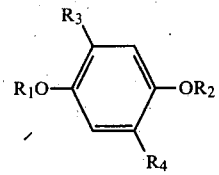

wherein $R_1$, $R_2$, $R_3$ and $R_4$ individually represent a alkyl, alkenyl, aryl or cycloalkyl group or $\text{\textendash}[A\text{\textendash}(X)_n]_m\text{\textendash}Cp$ in which Cp represents such a coupler residue linked to either the coupling-position or non-coupling position (preferably non-coupling position) as a yellow coupler residue (e.g. open chain active methylenetype yellow couplers), a magenta coupler residue (e.g. 5-pyrazolone type couplers, pyrazolinobenzimidazole type couplers, indazolone type couplers, pyrazolotriazole type couplers and cyanoacetyl type couplers) and a cyan coupler residue (e.g. phenol type couplers, α-naphthol type couplers and pyrazoloquinazolone type couplers), A represents a divalent aliphatic group, X represents a divalent linking group, and m and n individually represent a value of 0 or 1, provided that at least one of $R_1$, $R_2$, $R_3$ and $R_4$ represents $\text{\textendash}[A\text{\textendash}(X)_n]_m\text{\textendash}Cp$.

In the present couplers of the general formula [I], the alkyl group may be either straight chain or branched alkyls, preferably those of 1 to 32 carbon atoms, for example, typical of which are methyl, ethyl, n-butyl, t-butyl, 2-ethyl-hexyl, 3,5,5-trimethylhexyl, 2,2-dimethylpentyl, n-octyl, t-octyl, n-dodecyl, sec-dodecyl, n-hexadecyl, n-octadecyl and eicosyl; the alkenyl group may be either straight chain or branched alkenyls, preferably those of 2 to 32 carbon atoms, for example typical of which are allyl, butenyl octenyl and oleyl; the cycloalkyl group may preferably be those of 5- to 6-membered, for example, typical of which are cyclopentyl, cyclohexyl and cycloheptyl; and the aryl group typically includes, for example, phenyl and naphthyl, and these groups may have a substituent mentioned below.

The divalent aliphatic group typically includes an alkylene group (preferably those of 1 to 20 carbon atoms), alkenylene group (preferably those of 2 to 20 carbon atoms), a cycloalkylene group or a group comprising combinations of these groups. The divalent aliphatic group also may have a substituent. Typically, the alkylene group includes, for example, methylene, ethylene, propylene, n-butylene, s-butylene, 2-ethyl-hexylene, 2,2-dimethylpentylene, n-octylene and n-dodecylene; the alkenylene group includes propenylene, butenylene, octenylene and oleylene; and the cycloalkylene group may preferably those of 5- to 7-membered, for example, cyclopentylene, cyclohexylene and cycloheptylene.

The divalent linking group may be those commonly known, for example, typical of which are such groups as —O—, —NH—CO—, —NH—CO—NH—, —OCONH—, —COO—, —CO—, —CS—, —SO$_2$—, —CONH— and —SO$_2$NH—, which may have a substituent.

As mentioned above, the groups may individually have a substituent, and the substituent includes, for example, halogen atoms, cyano, nitro, amino, sulfo, hydroxy, carboxy, alkyl, alkenyl, aryl, alkoxy, alkenyloxy, aryloxy, heterocyclic, acyl, acylamino, carbamoyl, acyloxy, sulfonamido, sulfamoyl and cycloalkyl groups, and said substituent may further be substituted by the above-mentioned group.

In the aforesaid general formula [I], as mentioned previously Cp is a yellow, magenta or cyan coupler residue, preferably an acylacetonitrile yellow coupler residue, acylacetanilide yellow coupler residue, acylacetyl yellow coupler residue, 5-pyrazolone magenta coupler residue, indazolone magenta coupler residue, pyrazolinobenzimidazole magenta coupler residue, phenol cyan coupler residue, α-napthol cyan coupler residue or pyrazoloquinazolone cyan coupler residue.

Hereinafter, a residue from which at least one of $R_1$, $R_2$, $R_3$ and $R_4$ in the general formula [I] has been removed will be called B.

Useful as the magenta coupler residue may be those represented by the following general formula [II-a] or [II-b]:

General formula [II-a]

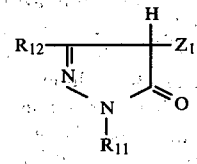

General formula [II-b]

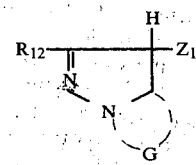

In the above formulae, $R_{11}$ and $R_{12}$ individually represent a group used in an ordinary 4-equivalent or 2-equivalent type pyrazolone coupler, and concrete the group represented by $R_{11}$ may include an alkyl group (e.g. methyl, ethyl, isopropyl, t-butyl, n-hexyl, t-octyl, dodecyl, octadecyl, etc.); alkenyl group (e.g. allyl, etc.); cycloalkyl group (e.g. cyclohexyl, etc.); terpenyl group (e.g. norbornyl, etc.); aryl group (e.g. phenyl, naphthyl, etc.); 5 or 6 membered heterocyclic group containing a nitrogen, oxygen or sulfur atom; (e.g. pyridyl, quinolyl, furylthiazolyl, benzothiazolyl, oxazolyl, benzoxazolyl, imidazolyl, benzoimidazolyl, naphthoxazolyl, etc.); ester group (e.g. methyl ester, ethyl ester, phenyl ester, benzyl ester, etc.); oxy group (e.g. methoxy, ethoxy, phenoxy, tolyloxy, etc.); thio group (e.g. ethylthio, propylthio, phenylthio, tolylthio, etc.); carboxy group; amino group (e.g. alkylamino, cycloalkylamino, N,N-dialkylamino, N-alkyl-N-allylamino, N-aryl, etc.); amido group (e.g. acetamido, α-(2,4-di-t-amylphenoxy)acetamido, α-butoxyphenoxypropionamido, benzamido, etc.); acylamino group (e.g. N-alkylacylamino, N-arylacylamino, etc.); ureido group (e.g. N-arylureido, N-alkylureido, etc.); thioureido group (e.g. N-alkylthioureido, N-arylthioureido, etc.); carbamoyl group (e.g. N-octadecylcarbamoyl, 3-pentadecylphenylcarbamoyl, etc.); thiocarbamoyl group; guanidino group (e.g. guanidino, N-alkylguanidino, N-arylguanidino, etc.); or sulfamoyl group. Each of the groups above mentioned may contain a substituent, that is for example the above said "alkyl" means "a substituted or unsubstituted alkyl". The substituent includes, for example a halogen, a nitro, amino, alkyl, aryl, alkoxy, aryloxy, ester, sulfamoyl, carbamoyl, ureido, heterocyclic, sulfonyloxy, oxo, acylamino, carboxy or sulfonamido. Paticularly useful as a group represented by $R_{11}$ is a phenyl group, at least one of the ortho-positions has been substituted by an alkyl or alkoxy group or a halogen atom.

The group represented by $R_{12}$ may include such group defined in the case of $R_{11}$ as the alkyl, aryl, heterocyclic, arylamino, acylamino, sulfonamido or ureido group.

G represents a heterocyclic ring selected from a triazole, imidazole or benzimidazole.

$Z_1$ represents a hydrogen atom or a group capable of being released (hereinafter called "split-off group") at the time of coupling of the coupler with an oxidation product of a color developing agent.

Of the groups represented by $R_{11}$, $R_{12}$, G and $Z_1$, at least one of them is substituted by the aforesaid $B{-}A{-}(X)_{\overline{n}\,\overline{m}}$, or one of at least $R_{11}$, $Z_1$ and $R_{12}$ is a group represented by $B{-}A{-}(X)_{\overline{n}\,\overline{m}}$.

The split-off group is preferably such substituent known in the photographic industry as a halogen atom, $-OR'$, $-OCOR'$, $-SR'$, $-OCONHR'$, $-O-SO_2NHR'$, $-NHCOR'$, $-NHSO_2R'$, $-NHR'$ (R' represents a hydrogen atom, an alkyl group, an aryl or a 5 or 6 membered heterocyclic having oxygen, nitrogen or sulfur atom group, which groups may have a substituent as mentioned in $R_{11}$.), $-SO_3H$, $-SCN$ or an azo group. Typical of the above-mentioned split-off group are those disclosed, for example, in Japanese Laid-Open-to-Public Publications Nos. 10135/1975, 91323/1975, 120334/1975, 130441/1975, 25228/1975, 37647/1976, 52828/1976 and 117422/1976, U.S. Pat. Nos. 3,617,291 and 3,227,550, and British Pat. No. 1,331,179.

Of the present couplers represented by the aforesaid general formula [II-a], those which are preferably include such couplers as represented by the following general formula [II'].

General formula [II']

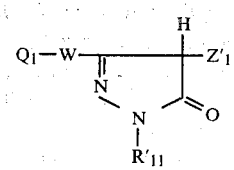

In the above formula, $R'_{11}$ has the same meaning as in the aforesaid $R_{11}$ and $Z'_1$ has the same meaning as in the aforesaid $Z_1$. $Q_1$ is such alkyl or aryl group as defined in the aforesaid $R_{12}$.

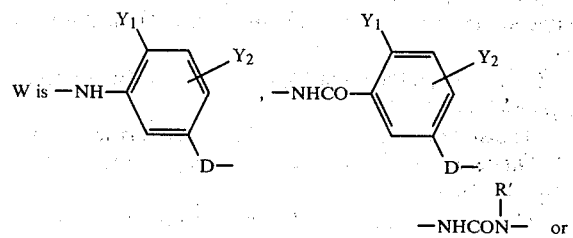

or $-NHCO$, in which formulas $Y_1$ is a hydrogen or halogen atom, or an alkyl or alkoxy group each having 1 to 10 carbon atoms, $Y_2$ has the same meaning as in $Y_1$, B' is a hydrogen atom or an alkyl group of 1 to 10 carbon atoms, and D is $-NHCO-$, $-CONH-$, $-NHSO_2-$, $-SO_2NH-$,

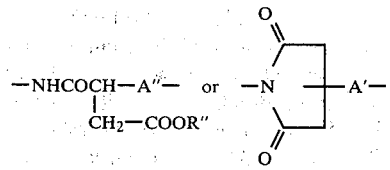

in which A' is a simple bond, $-O-$, $-S-$, $-SO_2-$ or $-NR'-$, A" has the same meaning as in A', R' is a hydrogen atom, or an alkyl, aryl or acyl group each having 1 to 10 carbon atoms; and R" is an alkyl group of 1 to 20 carbon atoms.

At least one of $Q_1$, $Z'_1$ and $R'_{11}$ is represented by the aforesaid $B{-}A{-}(X)_{\overline{n}\,\overline{m}}$, or substituted by the $B{-}A{-}(X)_{\overline{n}\,\overline{m}}$.

In the above formula, those which $Q_1$ is substituted by $B{-}A{-}(X)_{\overline{n}\,\overline{m}}$ are more preferable.

Useful as the yellow coupler residue are those represented by the following general formula [III].

General formula [III]

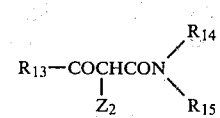

In the above formula, $R_{13}$, $R_{14}$ and $R_{15}$ individually represent a group used in an ordinary 4-equivalent or 2-equivalent type acylacetanilide coupler, and concretely typical of $R_{13}$ is, for example, an alkyl group (e.g. methyl, isobutyl, t-butyl, n-hexyl, t-hexyl, 1-methylpentyl, neopentyl, isohexyl, t-octyl, n-dodecyl, etc.), aryl group (e.g. phenyl naphthyl, etc.) and a 5 or 6 membered heterocyclic group containing an oxygen, nitrogen or sulfur atom (e.g. furanyl, pyridyl, thiazolyl, oxazolyl, benzoxazolyl, imidazolyl, etc.). Into each of the above-mentioned groups, may be introduced such substituent, for example, as a halogen atom, cyano, hydroxy, carboxy, amino, alkoxycarbonyl, aryloxycarbonyl, sulfo, alkyl, alkenyl, aryl, heterocyclic, alkoxy, alkenyloxy, aryloxy, arylthio, arylazo, acylamino, carbamoyl, ester, acyl, acyloxy, sulfonamido, sulfamoyl or sulfonyl group.

$R_{14}$ and $R_{15}$ are the groups which are the same or different, and typical of which is a hydrogen atom, an alkyl group (e.g. methyl, ethyl, n-butyl, n-dodecyl, etc.) or aryl group (e.g. phenyl, naphthyl, etc.). Into the above-mentioned alkyl or aryl group, may be introduced the same substituent as in the case of the aforesaid $R_{13}$.

$Z_2$ has the same meaning as in $Z_1$ of the aforesaid general formula [II].

And at least one of $R_{13}$, $R_{14}$, $R_{15}$ and $Z_2$, is substituted by the aforesaid B$\{$A—(X)$_n\}_m$ or represented by the B$\{$A—(X)$_n\}_m$.

The split-off group for $Z_2$ is preferably such a substituent known in the photographic industry as a halogen atom, —OR', —OCOR', —SR', —OCONHR', —OSO$_2$NHR', —NHCOR', —NHSO$_2$R', —NHR' (R' represents a hydrogen atom, an alkyl, aryl group or 5 or 6 membered heterocyclic group having an oxygen, nitrogen or sulfur atom), —SO$_3$H, —SCN, an azo group or 5 or 6 membered heterocyclic group containing oxygen, nitrogen or sulfur atom.

In the aforesaid general formula [III], preferably $R_{13}$ is a tert-alkyl group (e.g. tert-butyl, tert-amyl, tert-hexyl, tert-octyl, tert-dodecyl, etc.), an aryl group (e.g. phenyl, etc.), or an alkaryl group having an alkyl of 1 to 15 carbon atoms (e.g. 4-methylphenyl, 2-methyl-phenyl, 3,5-dimethylphenyl, 4-butyl-phenyl, 4-octyl-phenyl, 4-dodecylphenyl, etc.), and these groups may have a substituent.

Preferably, $R_{14}$ is a hydrogen atom, and $R_{15}$ is

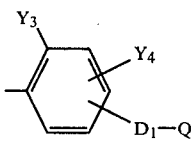

in which $Y_3$ has the same meaning as the aforesaid $Y_1$, $Y_4$ has the same meaning as the aforesaid $Y_2$, $D_1$ has the same meaning as the aforesaid D, and Q has the same meaning as the aforesaid $Q_1$.

Useful as the cyan coupler residue are those represented by the following general formulas [IV], [V] and [IV].

General formula [IV]

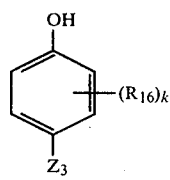

General formula [V]

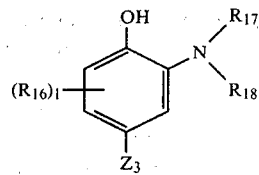

General formula (VI)

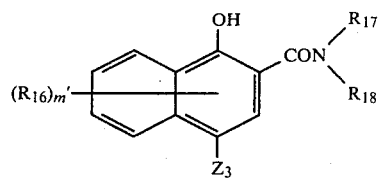

In the above formulas, $R_{16}$, $R_{17}$ and $R_{18}$ individually represent a group in an ordinary 4-equivalent type phenol or α-naphthol coupler, and concretely the group represented by $R_{16}$ includes a halogen atom, an aliphatic hydrocarbon residue, an acylamino group, —O—$R_{19}$ or —S—$R_{19}$ ($R_{19}$ is an aliphatic hydrocarbon residue), and when k is 2 or more; 2 or more $R_{16}$ may be same or different, said aliphatic hydrocarbon residue including those having substituents. $R_{17}$ and $R_{18}$ individually include a group selected from an aliphatic hydrocarbon residue, an aryl group and a heterocyclic residue an acyl sulfonyl group, or either one of $R_{17}$ and $R_{18}$ may be a hydrogen atom, and $R_{17}$ and $R_{18}$ individually include the above-mentioned groups having their respective substituents mentioned below. Furthermore, $R_{17}$ and $R_{18}$ may jointly form a nitrogen-containing heterocyclic nucleus, and k is an integer of 1 to 4, l is an integer of 0 to 3, and m' is an integer of 0 to 5. The aliphatic hydrocarbon residue may by any of those, either substituted or unsubstituted, or either straight chain, branched or cyclic, and typical of which are preferably an alkyl group (e.g. methyl, ethyl, propyl, isopropyl, butyl, t-butyl, isobutyl, dodecyl, octadecyl, etc.) and alkenyl group (e.g. allyl, octenyl, etc.). The aryl group includes a phenyl, naphthyl or the like group, and typical of the heterocyclic residue are pyridinyl, pyrazinyl, pyridazinyl, quinolyl, furalyl, thienyl, piperidyl, pyrrolyl, pyrrolinyl, tetrazolyl, thiazinyl, imidazolyl, morpholino, furyl, oxazolyl, thiazolyl, benzimidazolyl, benzoxazolyl and benzthiazolyl. As substituents to be introduced into the above-mentioned aliphatic hydrocarbon residue, aryl group and heterocyclic residue, there may be mentioned a halogen atom, a nitro, hydroxy, carboxy, amino, substituted amino, sulfo, alkyl, alkenyl, aryl, heterocyclic, alkoxy, aryloxy, arylthio, arylazo, acylamino, carbamoyl, ester, acyl, acyloxy, sulfonamido, sulfamoyl or sulfonyl group.

$Z_3$ is the same as $Z_1$ in the aforesaid general formula [II-a].

And at least one of $Z_3$ and $R_{16}$; and $Z_3$, $Z_{16}$, $R_{17}$ and $R_{18}$ in the general formula [IV]; and [V] and [VI] respectively, is substituted by the B$\{$A—(X)$_n\}_m$, or represented by the B$\{$A—(X)$_n\}_m$.

Of the couplers represented by the general formula [I], preferable are those in which at least one $R_1$, $R_2$, $R_3$ and $R_4$ has $\{$A—(X)$_n\}_m$Cp and the remaining ones are individually a branched or straight chain alkyl group of 1 to 30 carbon atoms. More preferable couplers are those in which $R_1$ and/or $R_2$ is $-[A-(X)_n]_m-Cp$ and $R_3$ and $R_4$ are individually a branched or straight chain alkyl group of 1 to 18 carbon atoms; or $R_1$ is $-[A-(X)_n]_m-Cp$, and $R_2$, $R_3$ and $R_4$ are individually a straight chain or branched alkyl group of 1 to 30 carbon atoms; or $R_3$ and/or $R_4$ is $-[A-(X)_n]_m-Cp$, and $R_1$ and $R_2$ are individually a branched or straight chain alkyl group of 1 to 30 carbon atoms.

Further preferable couplers are those in which $R_1$ is $-[A-(X)_n]_m-Cp$ and $R_2$, $R_3$ and $R_4$ are individually a branched or straight chain alkyl group of 1 to 18 carbon atoms, and in which $R_1$ and $R_2$ are individually $-[A-(X)_n]_m-Cp$ and $R_3$ and $R_4$ are individually a branched or straight chain alkyl group or 1 to 18 carbon atoms. Still further preferable couplers are those in which $R_1$ and $R_2$ are individually $-[A-(X)_n]_m-Cp$ and $R_3$ and $R_4$ are individually a lower branched alkyl group.

Preferably, A is a branched or straight chain alkylene group of 1 to 18 carbon atoms, X is —CONH— or —NHCO— group, and n and m is individually a value of 1.

Particularly preferable are pyrazolone magenta couplers represented by the general formula [II′].

Exemplified below, illustratively but not limitedly, are typical of the present coupler.

(Exemplified compound)

(M-1)

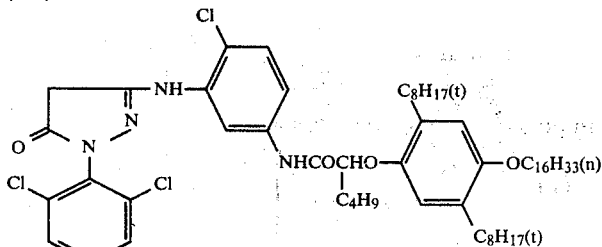

(M-2)

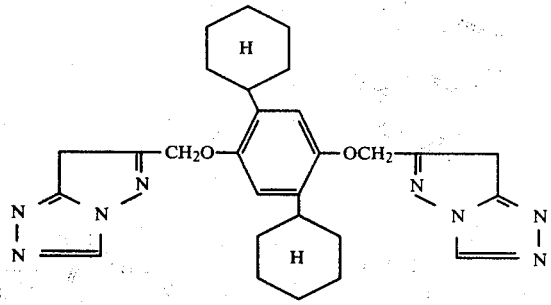

(M-3)

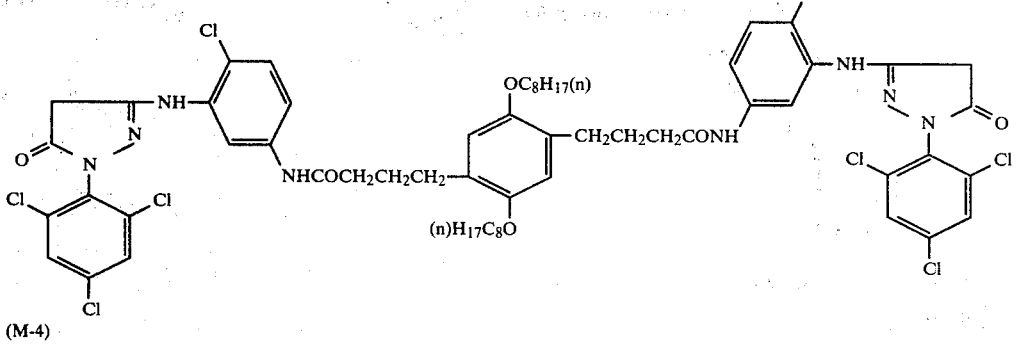

(M-4)

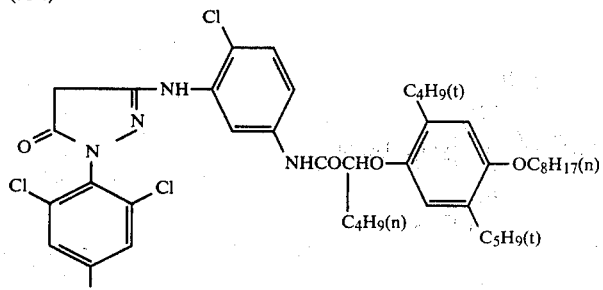

(M-5)

-continued
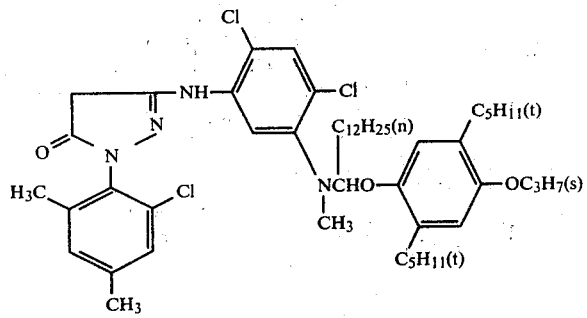
(M-6)
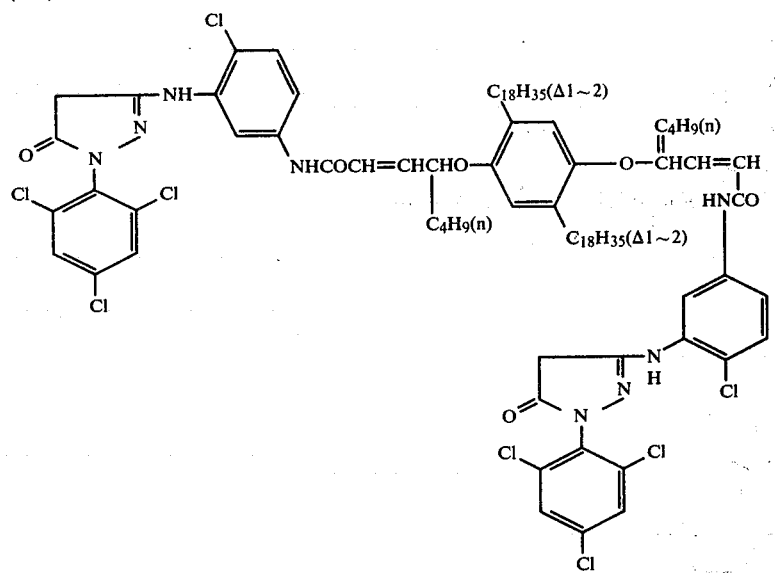
(M-7)
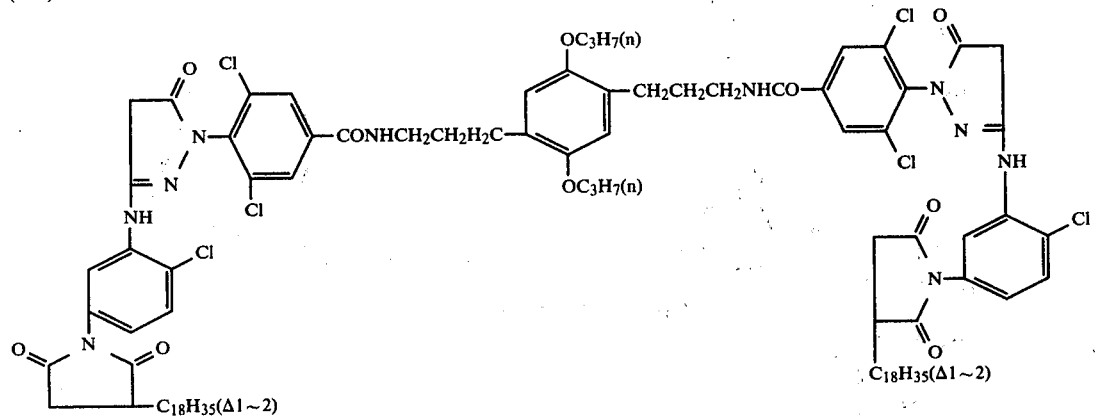
(M-8)
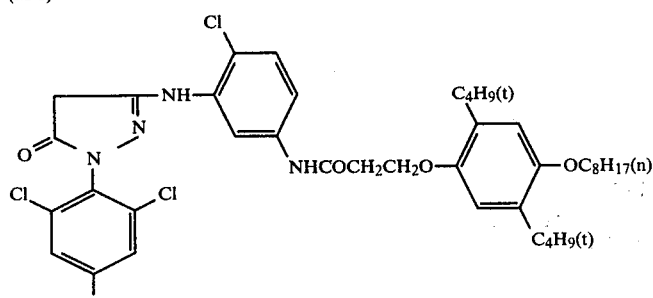
(M-9)

-continued
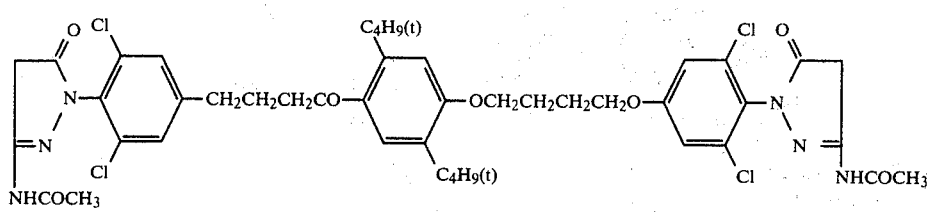
(M-10)
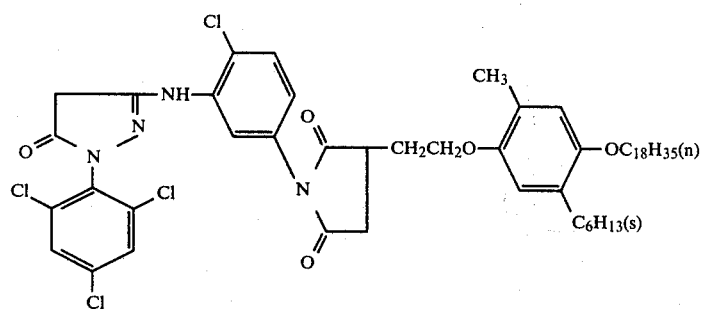
(M-11)
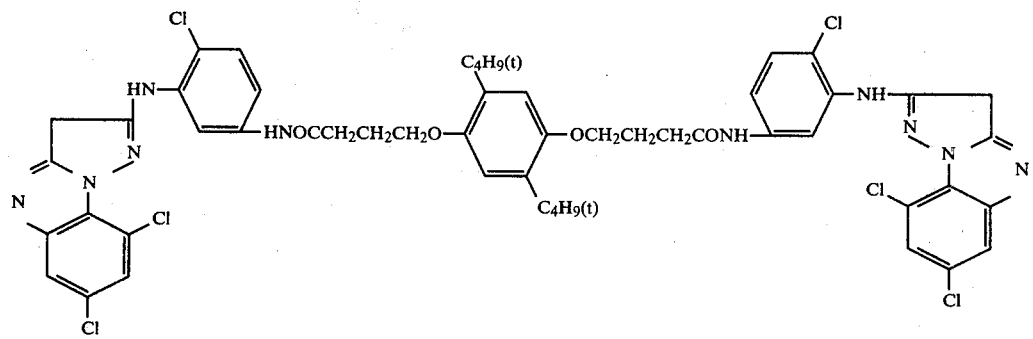
(M-12)
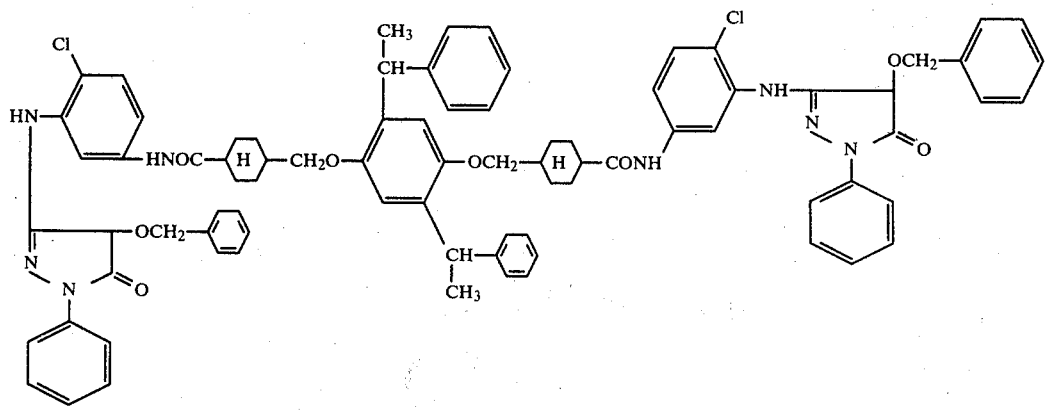
(M-13)

-continued
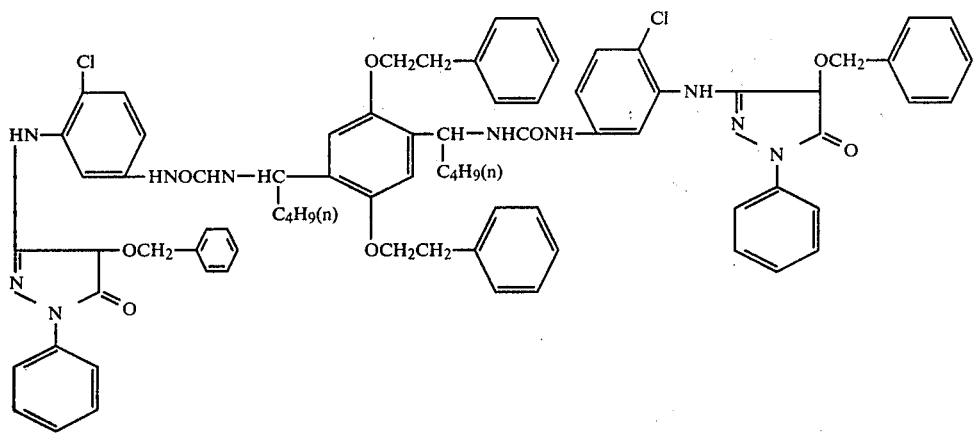
(M-14)
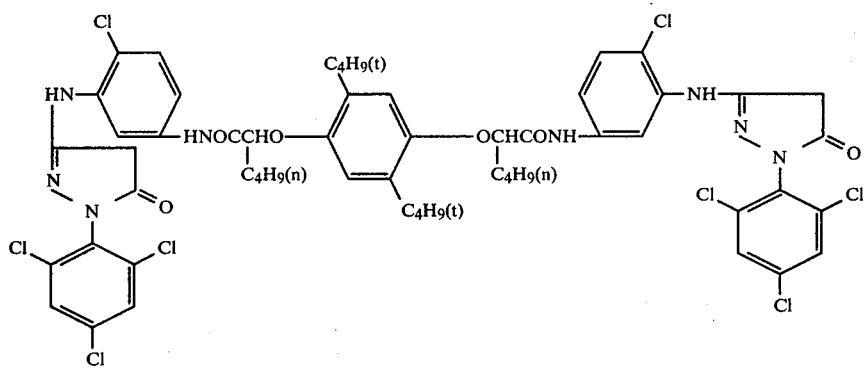
(M-15)
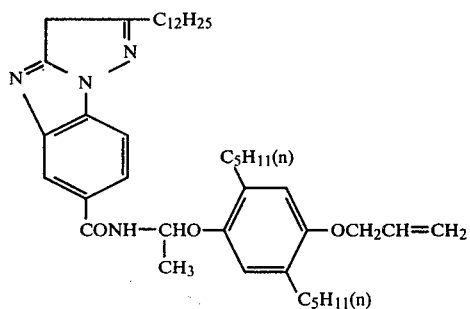
(M-16)
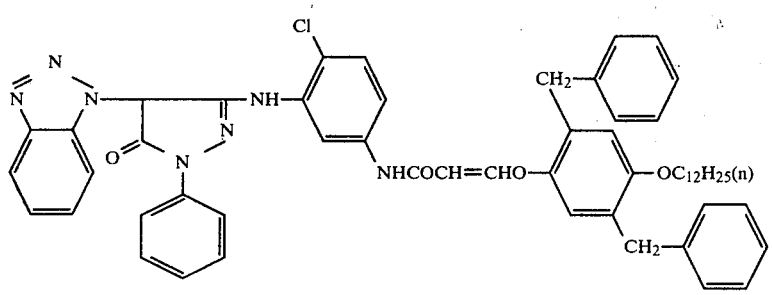
(M-17)

-continued
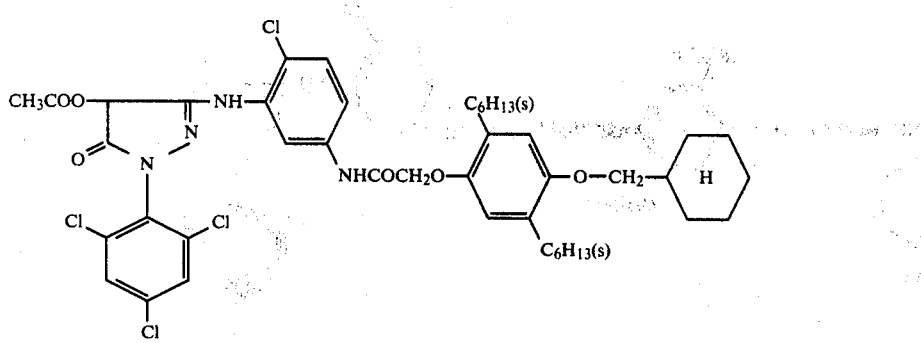
(M-18)
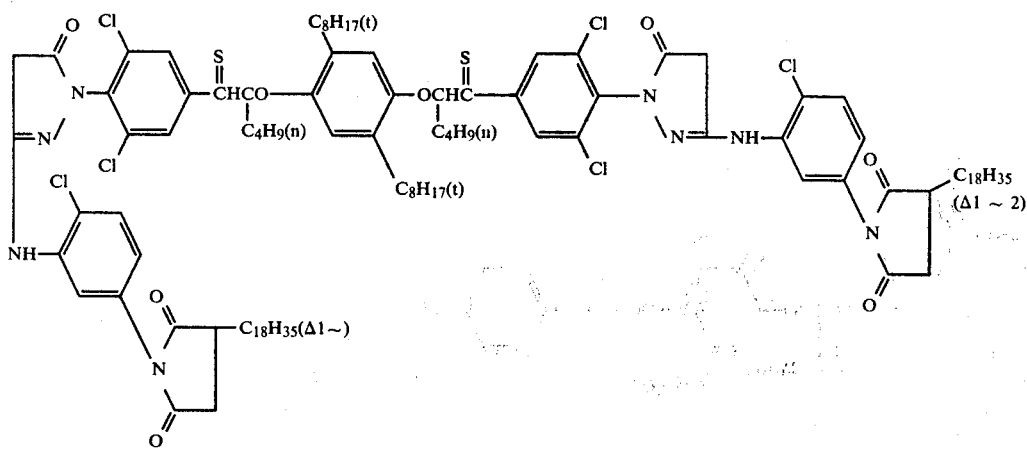
(M-19)
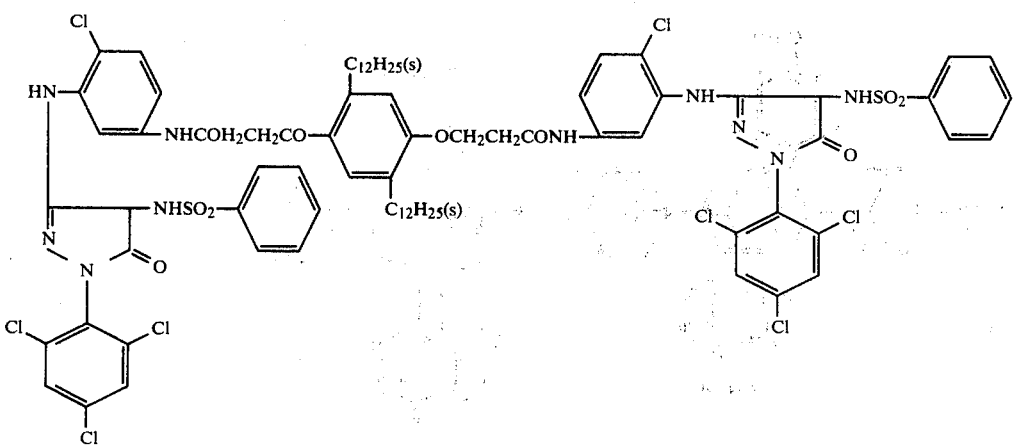
(M-20)

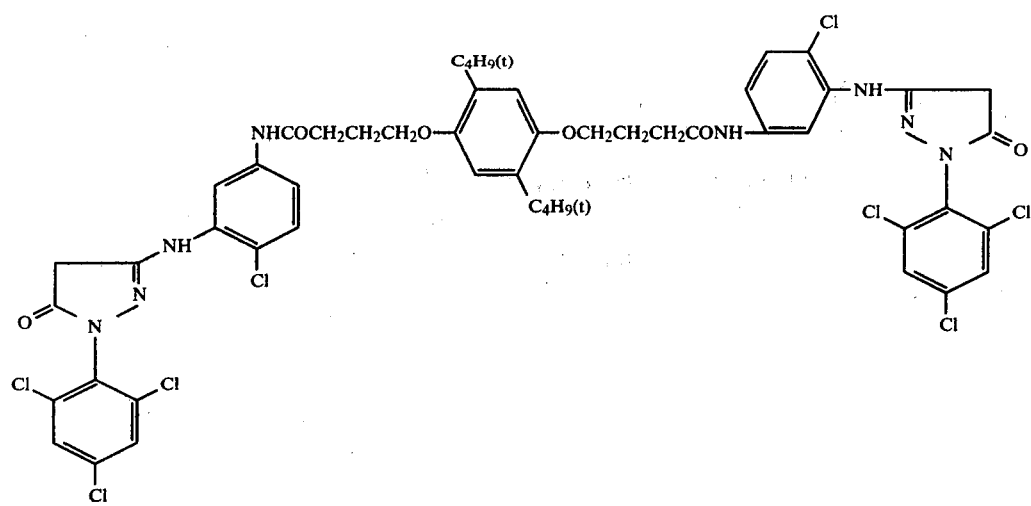
(M-21)
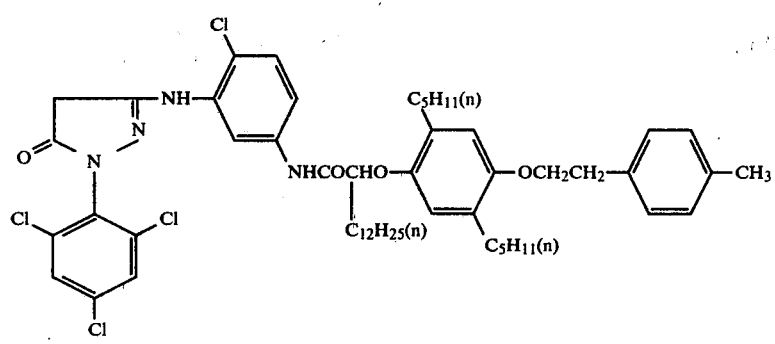
(M-22)
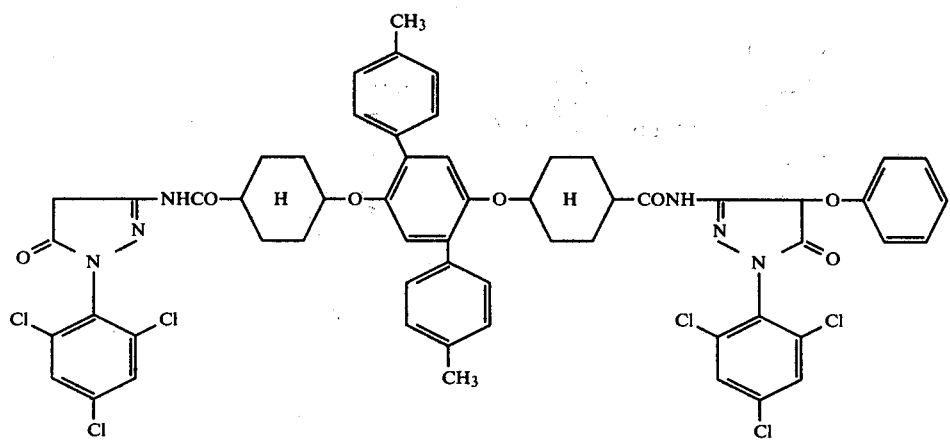
(M-23)

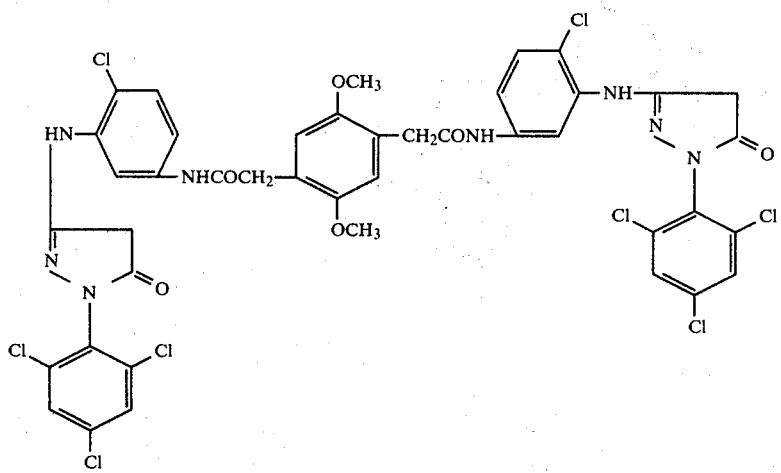
(M-24)
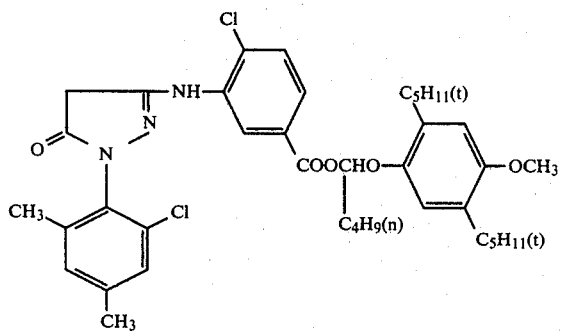
(M-25)
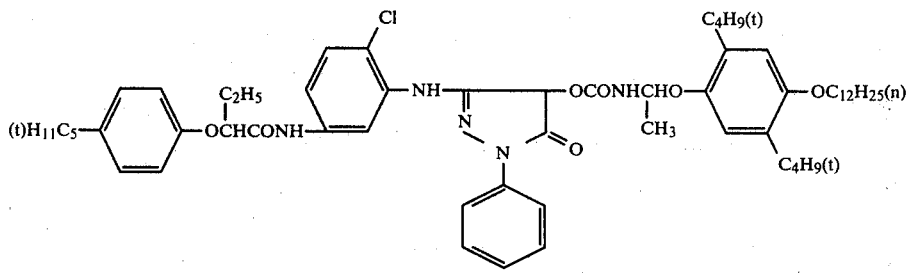
(M-26)
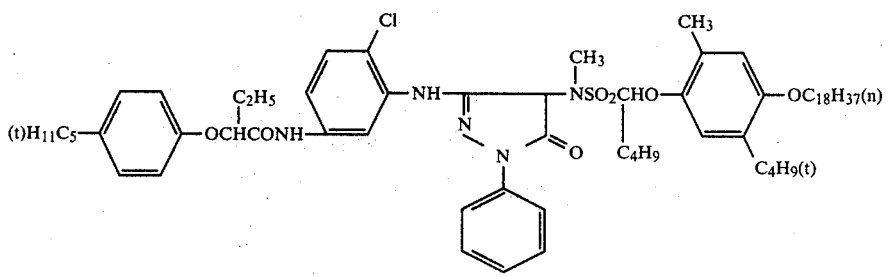
(M-27)

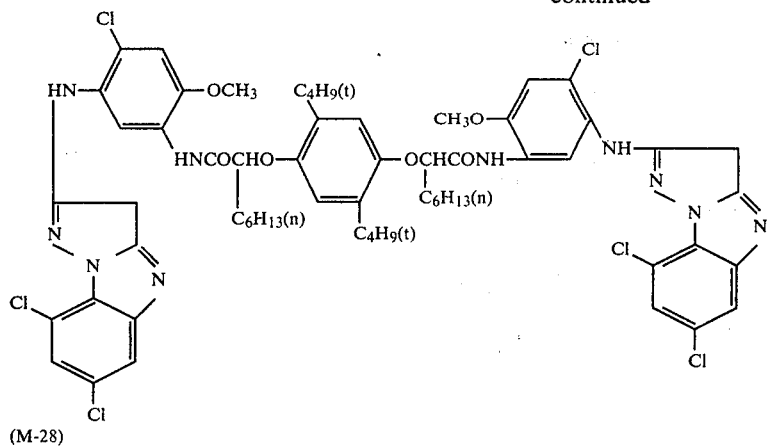
(M-28)
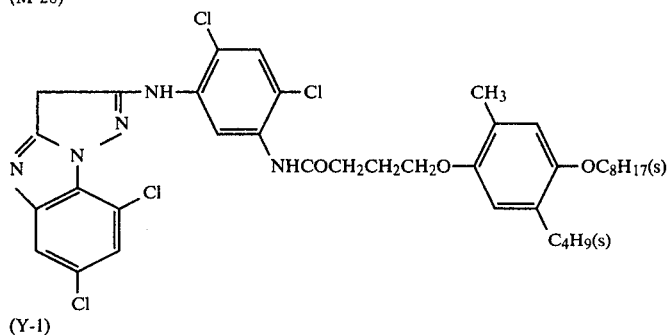
(Y-1)
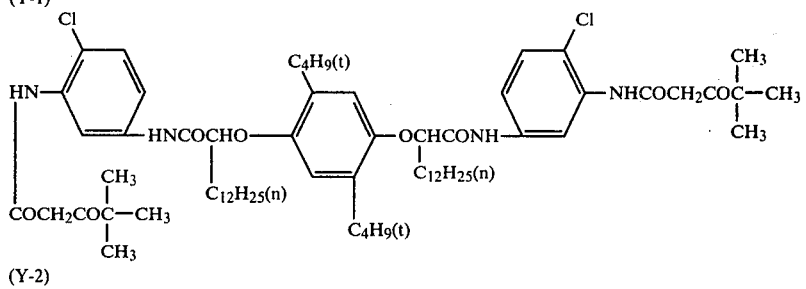
(Y-2)
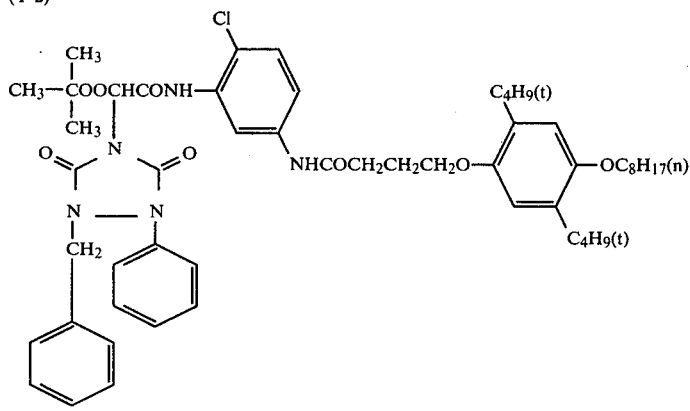
(Y-3)
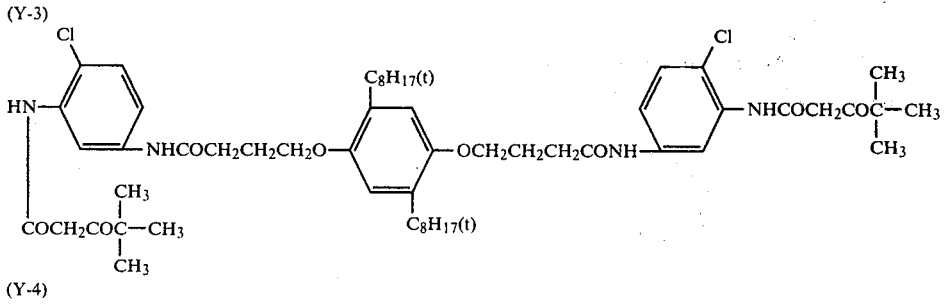
(Y-4)

-continued
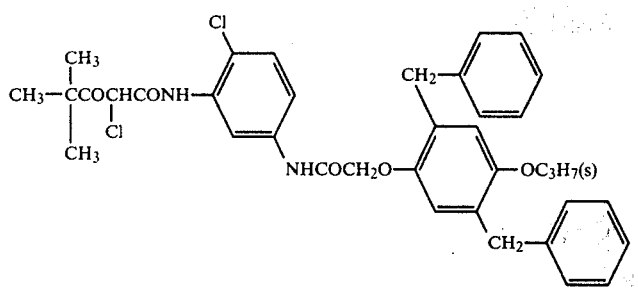
(Y-5)
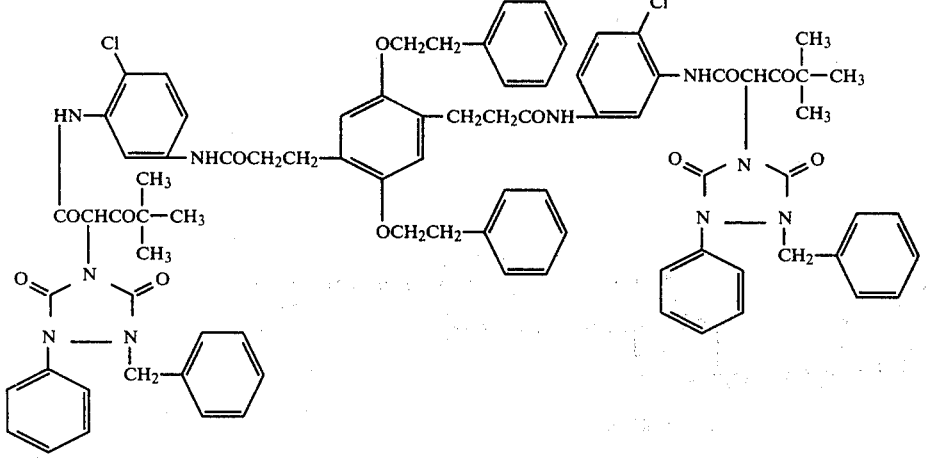
(Y-6)
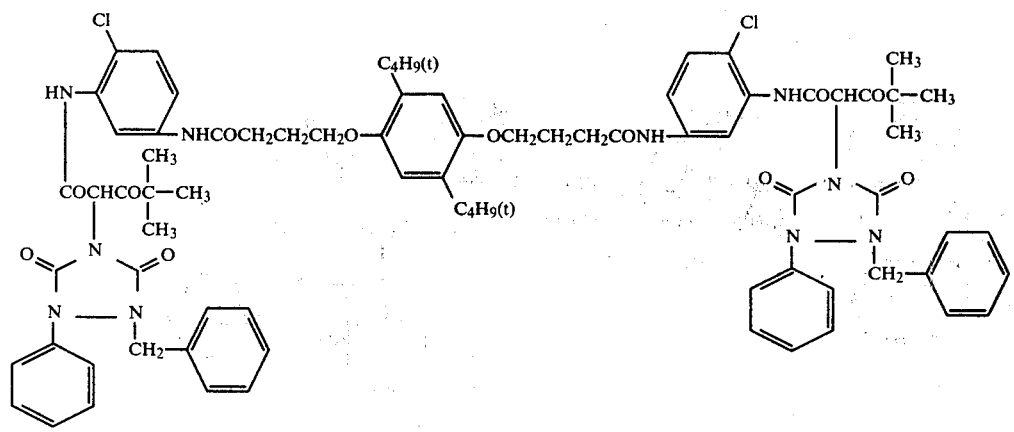
(Y-7)
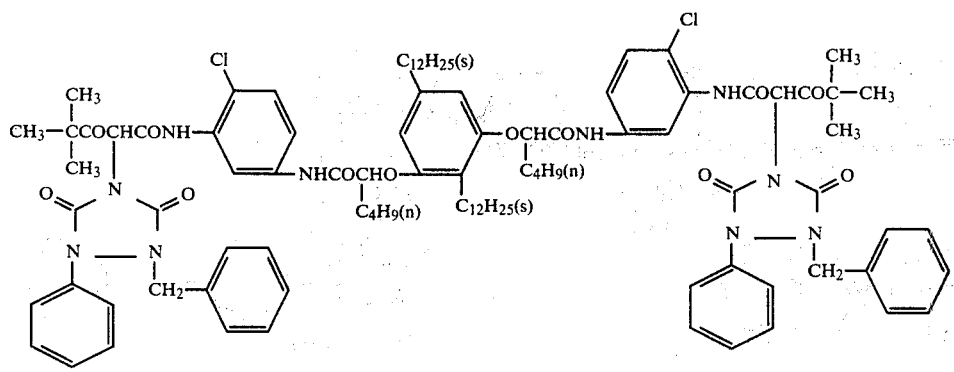
(Y-8)

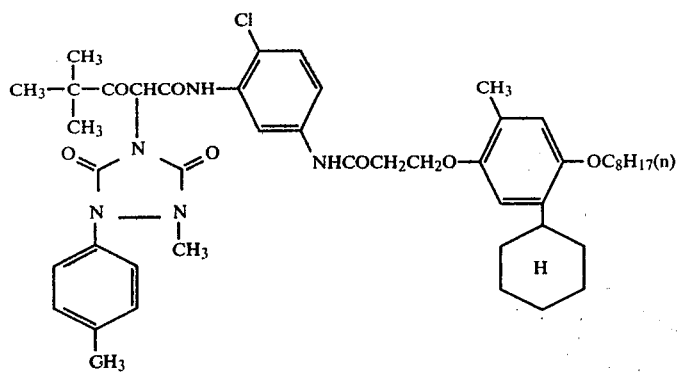
(Y-9)
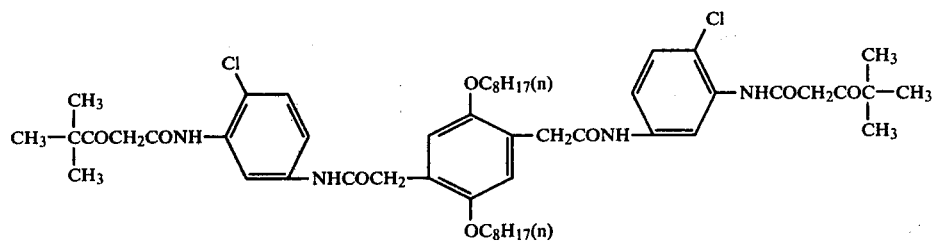
(Y-10)
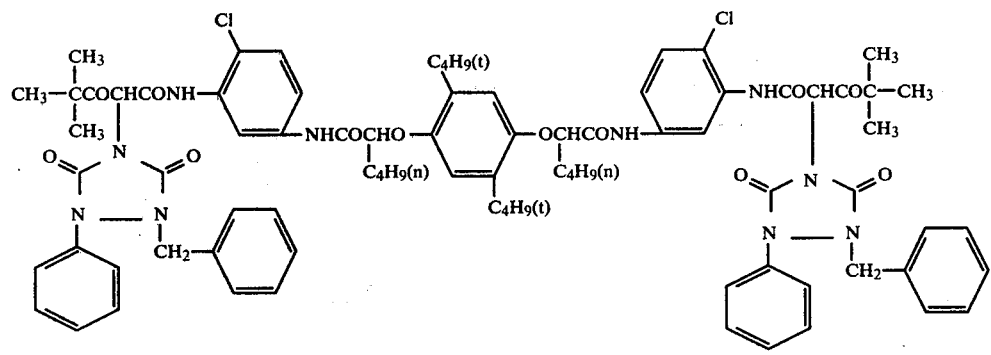
(Y-11)
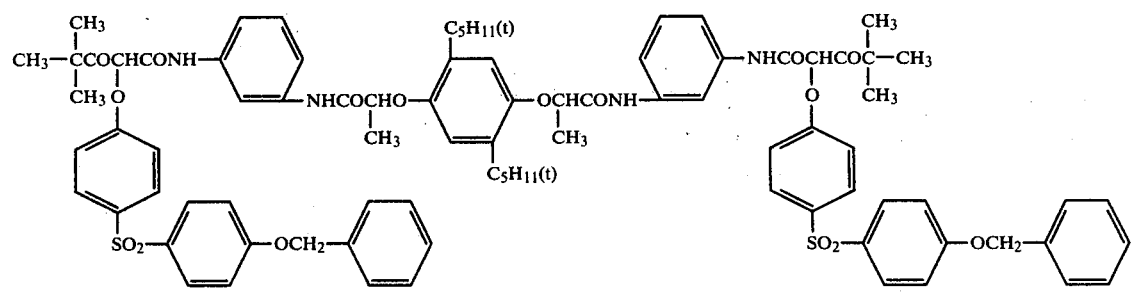
(Y-12)

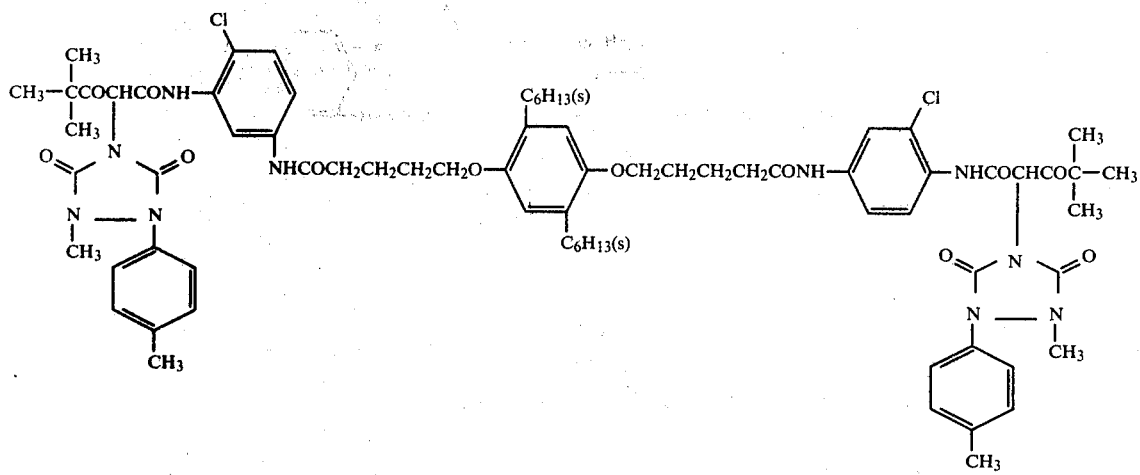
(Y-13)
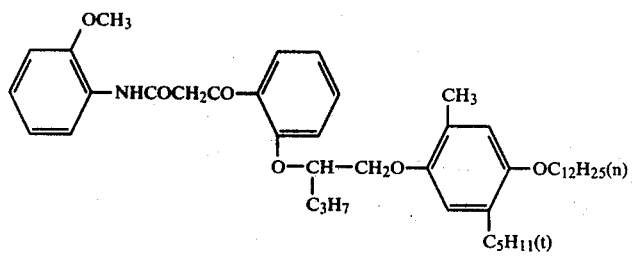
(Y-14)
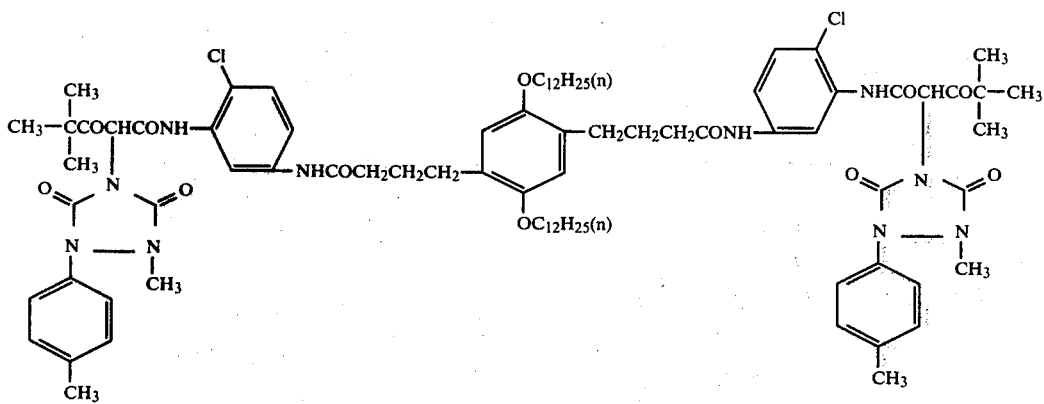
(Y-15)
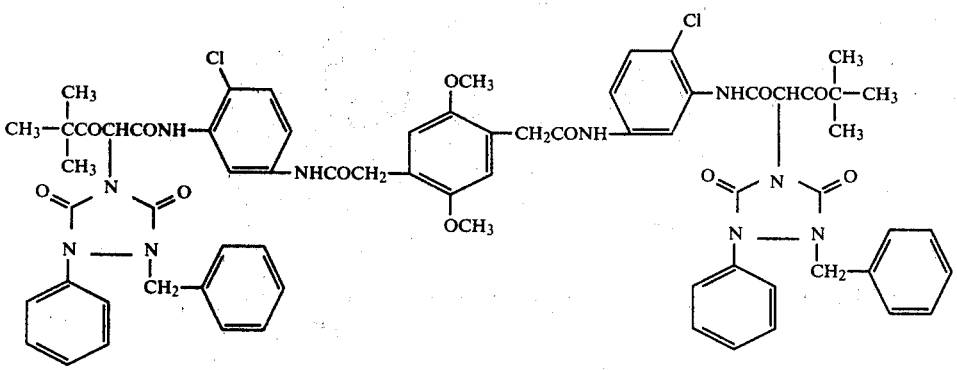
(Y-16)

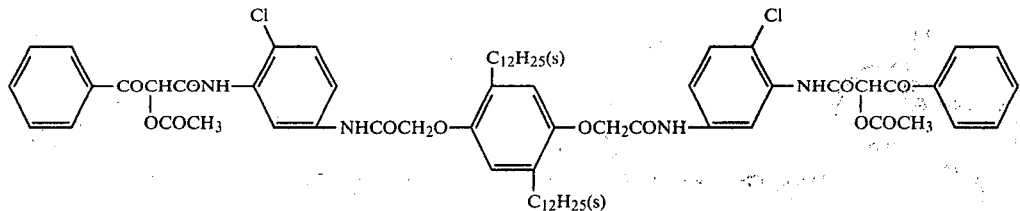
(Y-17)
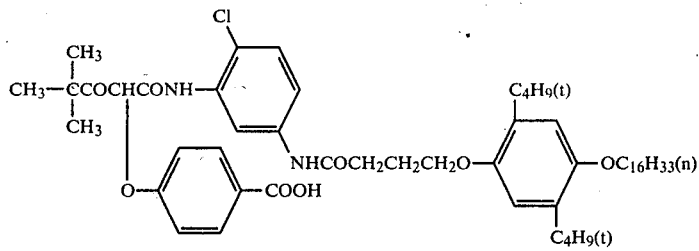
(Y-18)
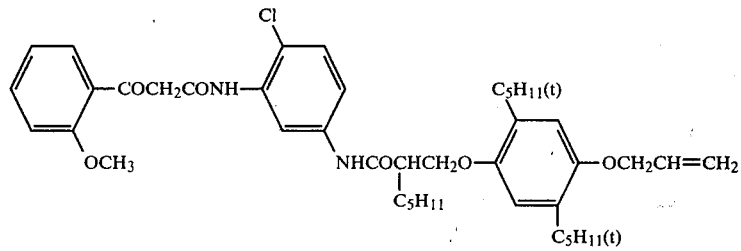
(C-1)
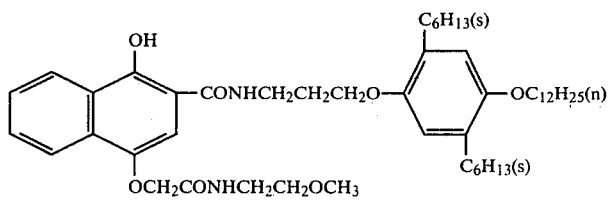
(C-2)
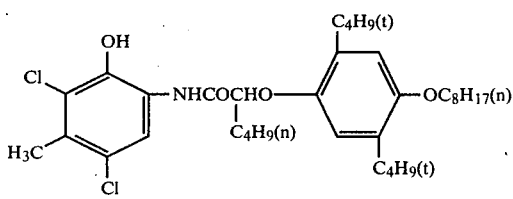
(C-3)
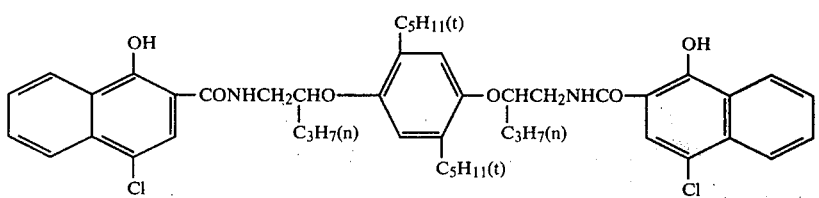
(C-4)
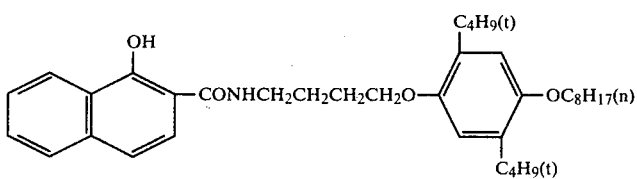
(C-5)

-continued
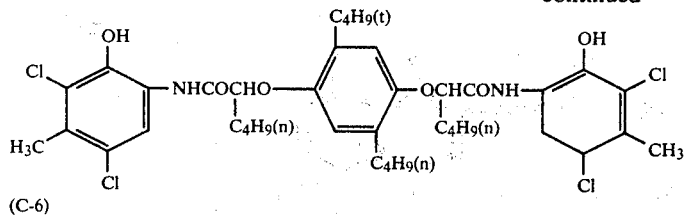
(C-6)
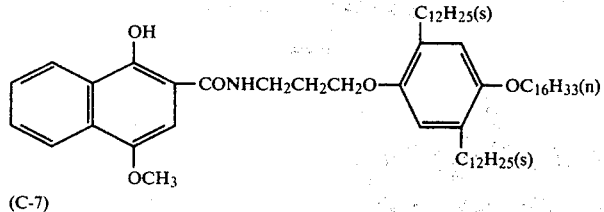
(C-7)
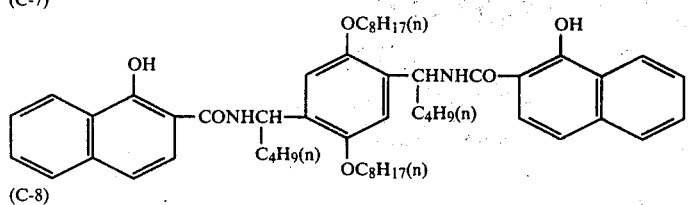
(C-8)
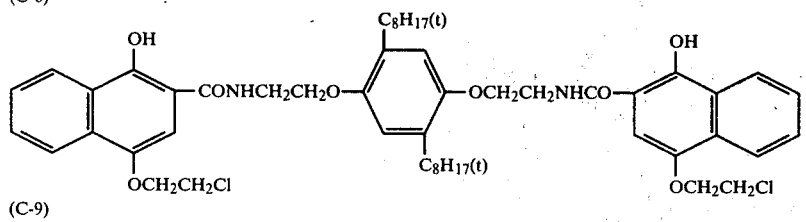
(C-9)
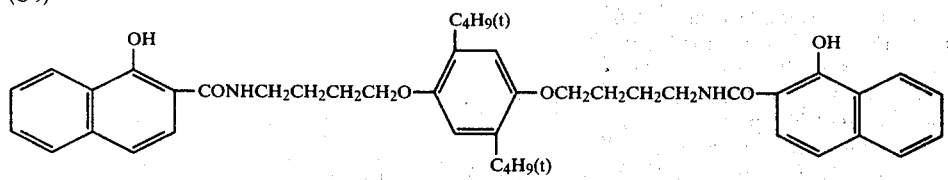
(C-10)
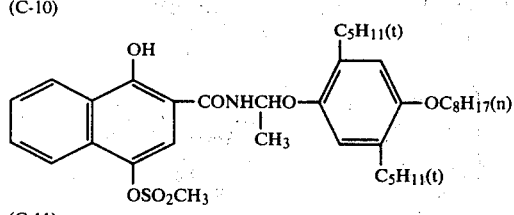
(C-11)
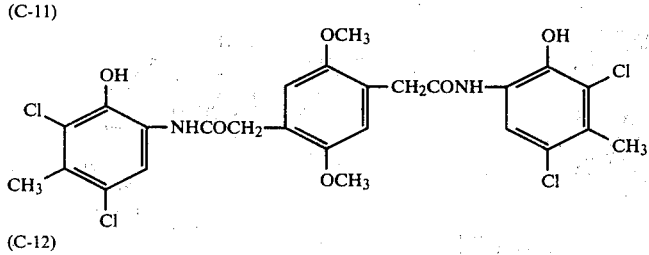
(C-12)
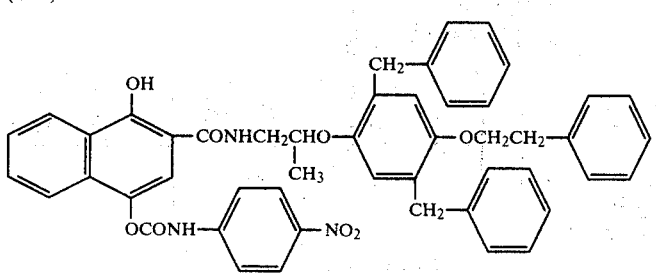

(C-13)

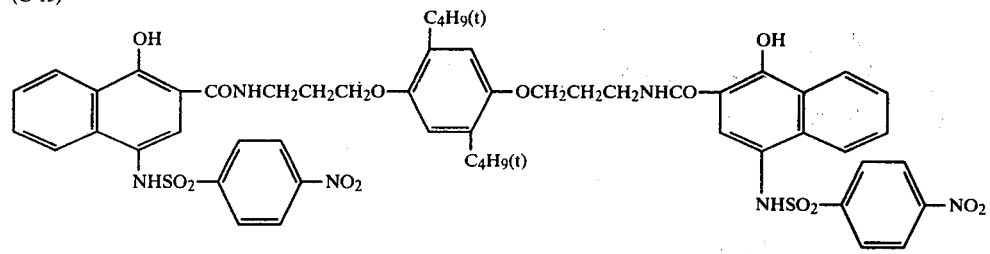

(C-14)

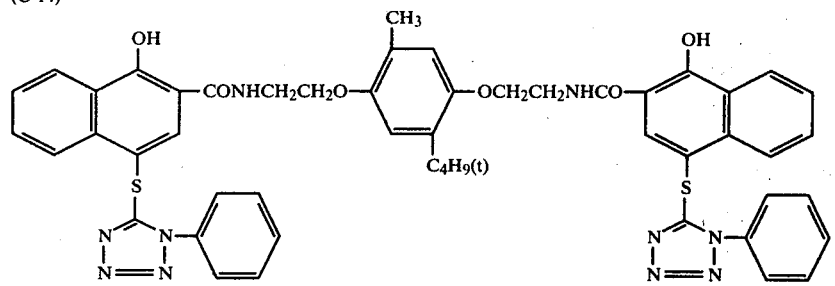

(C-15)

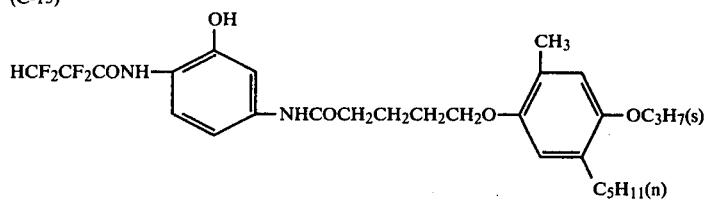

The present couplers have been successful in improving the resultant dye images in its stability against light even for a long exposure to light and, at the same time, in preventing the occurrence of Y stain in unexposed portions by introducing a specific group having oxidation inhibiting ability into any optional position of the molecular structure of a coupler used in a color photosensitive material in the manner as shown in the aforesaid general formula [I].

It was a real surprise to find that in addition to the above-mentioned effects, the present couplers are excellently soluble in high boiling solvents, excellent in stability even when dispersed in silver halide emulsions and free of hinderence to color development, give their respective dyes having light absorption wavelengths with in desirable ranges, do not exert any adverse influence on photographic properties, and excellent not only in stability against light but also such fastness as stability to oxidative species derived by the action of visible ray, thermal resistance and moisture resistance.

Further, in the case of the couplers according to the present invention, for example, a coupler of the general formula [I] in which $R_1$ and $R_2$ are individually —A—$(X)_n$Cp, n is 1, A is

—CH—,
|
R' and X is —CONH—, the synthesis thereof can be accomplished simply by two stages as shown in the following reaction scheme.

(In the following reaction scheme, $R_3$ and $R_4$ are the same groups as defined in the general formula [I], R' represents a hydrogen atom or an alkyl group, and W represents a coupler residue.)

(First stage)

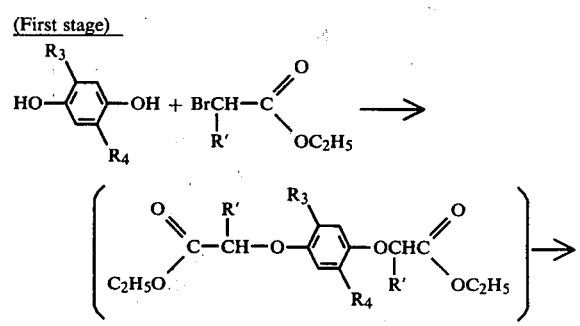

(Intermediate 1)

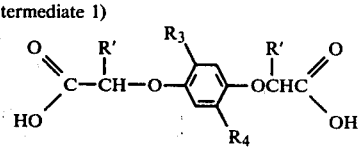

(Compound 1)

(Second stage)

(Compound 1) $\xrightarrow{SOCl_2}$

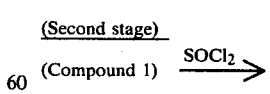

(Intermediate 2)

-continued

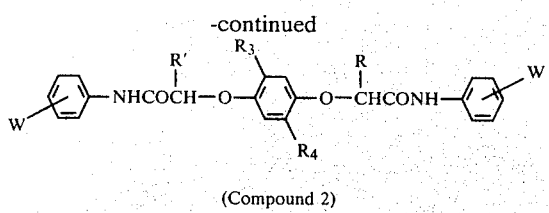

(Compound 2)

In case where the present couplers are synthesized, compound 1 is obtained in a pure form at the first stage without isolating and purifying intermediate 1, and after the reaction of forming compound 2, isolation and purification of the compound 2 thus formed can be easily be accomplished.

Some representatives of the present coupler are illustrated below with reference to synthesis examples.

SYNTHESIS EXAMPLE 1

Synthesis of exemplified coupler (M-4)

(a) Synthesis of intermediate compound (1) [α-(2,5-di-t-Butyl-4-octyloxyphenoxy)capronic acid]

To a suspension of 265 g of 50% sodium hydride in 5 liters of dimethylformamide (DMF) is added 850 g of 2,5-di-tert-butyl-4-octyloxyphenol, and the resulting mixture is heated at 80° C. in a nitrogen stream for 2 hours.

After cooling down to room temperature, the mixture was charged with 625 g of ethyl α-bromocapronate, followed by heating at 80° C. for 4 hours. After cooling, the mixture is poured into 25 liters of ice-cold water and acidified with concentrated hydrochloric acid, followed by standing overnight in a cold place.

A diether compound which has crystallized out of the ice-cold water is filtered with suction and then recrystallized from methanol/water to obtain intermediate compound (1), m.p. 140°-142° C.

(b) Synthesis of exemplified coupler (M-4)

A solution of 900 g intermediate compound (1) in 9 liters of carbon tetrachloride is refluxed for 1 hour with 417 g of phosphorus pentachloride, folowed by evaporating while heating under reduced pressure at 150° C. The residue is charged with 30 liters of acetonitrile and 1-(2,4,6-trichlorophenyl)-3-(5-amino-2-chloroanilino)-pyrazolone, followed by refluxing for 2 hours. After cooling, the crystallized (M-4) is separated by filtration and then recrystallized from methanol/water to obtain the title coupler, m.p. 71°-73° C.

SYNTHESIS EXAMPLE 2

Synthesis of exemplified coupler (M-8)

(a) Synthesis of intermediate compound (1) [γ-(2,5-di-t-butyl-4-octylphenoxy)propionitrile]

A solution of 410 g of 2,5-di-tert-butyl-4-octyloxyphenol, 150 g of 4-cyanopropyl chloride, 20 g of potassium iodide and 96.6 g of potassium hydroxide in 3 liters of ethanol is refluxed for 3 hours, followed by cooling.

After filtration with suction, a reaction product obtained is recrystallized from ethanol to give the title intermediate compound, m.p. 90°-91° C.

(b) Synthesis of intermediate compound (II) [γ-(2,5-di-tert-Butyl-4-octyloxyphenoxy)propionic acid]

A mixture comprising 600 g of intermediate compound (II), 390 g of potassium hydroxide and 1.2 liters of 50% aqueous ethanol solution is refluxed for 12 hours.

The resulting mixture is acidified with concentrated hydrochloric acid, and a crystallized product obtained by filtration with suction is recrystallized from methanol to give the title intermediate compound, m.p. 139°-140° C.

(c) Synthesis of exemplified coupler (M-8)

A solution of 250 g of intermediate compound (II) in 2 liters of carbon tetrachloride is charged with 150 g of phosphorus pentachloride, refluxed for 1 hour and then evaporated under reduced pressure while heating at 150° C. The residue is charged with 5 liters of acetonitrile, 230 g of 1-(2,4,6-trichlorophenyl)-3-(5-amino-2-chloroanilino)pyrazolone and 50 ml of pyridine and refluxed for 2 hours. After cooling, a crystallized product obtained by filtration with suction is recrystallized from ethanol to obtain the title coupler, m.p. 185°-199° C.

SYNTHESIS EXAMPLE 3

(a) Synthesis of intermediate compound (I) [2,5-di-t-Butyl-p-phenylenedioxy-α,α'-biscapronic acid]

To a solution of 444 g of 2,5-di-t-butyl hydroquinone in 3.2 liters of DMF is added with stirring 230 g of 50% sodium hydride, and the resulting mixture is heated at 80°-100° C. for 2 hours.

The mixture charged with 892 g of ethyl α-bromocapronate is heated for additional 5 hours, poured in 3 liters of ice-cold water, acidified with concentrated hydrochloric acid and allowed to stand overnight in a cold place.

A crystallized product collected by filtration with suction is dried and fractionally recrystallized from chloroform to obtain isomer-a and isomer-b (hereinafter called "I-a" and "I-b" respectively).

I-a: m.p. 221°-224° C.

I-b: m.p. 180°-182° C.

(b) Synthesis of exemplified coupler (M-14)

A solution of 230 g of I-a of the intermediate compound (I) of Synthesis Example 2 in a mixture of 1.3 liters of thionyl chloride and 10 ml of pyridine is refluxed for 1 hour. After distilling off an excess thionyl chloride, the solution is charged with 4 liters of acetonitrile, 90 g of pyridine and 400 g of 1-(2,4,6-trichloro-phenyl)-3-(5-amino-2-chloro-anilino)pyrazolone and then refluxed for 2 hours. A product separated by filtration with suction is recrystallized from chloroform to obtain the title coupler, m.p. 302°-304° C.

A reaction of the same scale as in (b) of Synthesis Example 3 is effected but using I-b of the intermediate compound (I) of Synthesis Example 3 to obtain the title coupler, m.p. 170°-174° C.

SYNTHESIS EXAMPLE 4

Synthesis of exemplified coupler (M-23)

(a) Synthesis of exemplified coupler (M-23)

A solution of 260 g of 2,5-dimethoxy-1,4-phenylenediacetic acid (prepared according to a process described in Bulletin of The Chemical Society of Japan, Vol. 50, 3388–3392, 1977) and 5 ml of pyridine in 2 liters of thionyl chloride is refluxed mildly for 30 minutes. Crystals separated by filtration is refluxed for 30 minutes together with 800 g of 1-(2,4,6-trichloro-phenyl)-3-(5-amino-2-chloroanilino)pyrazolone in 20 liters of acetonitrile. A crystallized product separated by filtration is recrystallized from acetonitrile to obtain the title coupler, m.p. 195°-197° C.

SYNTHESIS EXAMPLE 5

Synthesis of exemplified coupler (Y-2)

(a) Synthesis of exemplified coupler (Y-2)

A solution of 300 g of the intermediate compound (II) of Synthesis Example 2 in 5 liters of carbon tetrachloride charged with 148.6 g of phosphorus pentachloride is refluxed for 1 hour, followed by evaporating under reduced pressure. The residue is charged with 10 liters of acetonitrile, 398 g of 5-amino-2-chloro-α-pivaroyl-α-(1-benzyl-2-phenyl-1,2,4-triazolizine-3,5-dione)acetanilide (hereinafter called "acetanilide derivative") and 56 g of pyridine and then refluxed for 2 hours. After distilling off the solvent under reduced pressure, the residue is recrystallized from benzene-n-hexane to obtain the title coupler, m.p. 93°–95° C.

SYNTHESIS EXAMPLE 6

Synthesis of exemplified coupler (Y-6)

(a) Synthesis of intermediate compound (I) [2,5-di-t-Butyl-bis-(γ-cyano-propoxy)benzene]

A solution of a mixture comprising 440 g of 2,5-di-t-butyl hydroquinone, 500 g of 3-cyano-propyl chloride and 320 g of potassium hydroxide in 5 liters of ethanol is refluxed in a nitrogen stream for 4 hours. Crystals deposited are collected by filtration and then recrystallized from ethanol to obtain the title intermediate compound, m.p. 155°–156° C.

(b) Synthesis of intermediate compound (II) [2,5-di-t-Butyl-p-phenylene-dioxy-γ,γ'-bisbutyric acid]

A mixture comprising 356 g of the intermediate compound (I) of Synthesis Example 6, 263 g of potassium hydroxide, 1.7 liters of water and 3.5 liters of ethanol is refluxed for 14 hours. After acidification with concentrated hydrochloric acid, crystals deposited are collected by filtration and then recrystallized from methanol to obtain the title intermediate compound, m.p. 238°–239° C.

(c) Synthesis of exemplified coupler (Y-6)

A mixture of 250 g of the intermediate compound (II) and 1.3 liters of thionyl chloride is charged with 20 g of pyridine and then refluxed for 1 hour. After evaporating under reduced pressure, the residue is charged with 716 g of the aforesaid acetanilide derivative, 120 g of pyridine and 10 liters of acetonitrile and then refluxed for 2 hours. After distilling off the solvent, the residue is recrystallized from benzene to obtain the title coupler, m.p. 132°–134° C.

SYNTHESIS EXAMPLE 7

Synthesis of exemplified coupler (Y-10)

A mixture of 230 g of I-a of the intermediate compound (I) of Synthesis Example 3 and 1.3 liters of thionyl chloride is charged with 25 g of pyridine and then refluxed for 1 hour. After evaporating under reduced pressure, the residue is charged with 530 g of the acetanilide derivative, 90 g of pyridine and 1 liter of acetonitrile and refluxed for 2 hours. After distilling off the solvent under reduced pressure, the residue is purified by column chromatography on silica gel to obtain the title coupler, m.p. 128°–130° C.

On the one hand, the same reaction as above is effected but using I-b of the intermediated compound (I) of Synthesis Example 3 to obtain an isomer of exemplified coupler (Y-10), m.p. 120°–123° C.

SYNTHESIS EXAMPLE 8

Synthesis of exemplified coupler (Y-15)

A mixture comprising 254 g of 2,5-dimethoxy-1,4-phenylenediacetic acid used in Synthetic Example 4, 2 liters of thionyl chloride and 50 ml of pyridine is refluxed for 1 hour. A crystallized product collected by filtration is mixed with 1.1 kg of the acetanilide derivative, 100 g of pyridine and 10 liters of acetonitrile, and the mixture is refluxed for 30 minutes. A deposited product collected by filtration is recrystallized from acetonitrile to obtain the title coupler, m.p. 288° C.

SYNTHESIS EXAMPLE 9

Synthesis of exemplified coupler (C-2)

A mixture comprising 230 g of the intermediate compound (I) of Synthesis Example 1, 104 g of phosphorus pentachloride and 3 liters of carbon tetrachloride is refluxed for 30 minutes. After evaporating to dryness under reduced pressure, the residue is charged with 114 g of 2-hydroxy-2,4-dichloro-4-methylaniline hydrochloride, 39.5 g of pyridine and 10 liters of acetonitrile and then refluxed for 3 hours. After distilling off the solvent under reduced pressure, the residue is recrystallized from methanol to obtain the title coupler, m.p. 93°–95° C.

SYNTHESIS EXAMPLE 10

Synthesis of exemplified coupler (C-4)

(a) Synthesis of intermediate compound (I) [4-(2,5-di-t-Butyl-4-octyloxyphenoxy)butylamine]

To a suspension of 142 g of lithium aluminum hydride in 8 liters of anhydrous ether is added a solution of 400 g of the intermediate compound (1) of Synthesis Example 2, and the mixture is refluxed for 3 hours. An excess of lithium aluminum hydride is decomposed with acetone and then with acetic acid. After filtration, the filtrate is evaporated under reduced pressure to dryness and then recrystallized from methanol-water to obtain the title intermediate compound, m.p. 72°–73° C.

(b) Synthesis of exemplified coupler (C-4)

A mixture of 200 g of the intermediate compound (I) of Synthesis Example 10 and 130 g of phenyl 1-hydroxynaphthalene-2-carboxylate is heated with stirring under reduced pressure at 150° C. for 1 hour. After cooling, the reaction product obtained is recrystallized from methanol to give the title coupler, m.p. 124°–126° C.

SYNTHESIS EXAMPLE 11

Synthesis of exemplified coupler (C-5)

A mixture comprising 230 g of I-a of the intermediate compound (I) of Synthesis Example 3 and 1.3 liters of thionyl chloride is charged with 20 ml of pyridine and then refluxed for 1 hour. After distilling off an excess of thionyl chloride under reduced pressure, the residue is evaporated. The resultant is charged with 230 g of 2-hydroxy-3,5-dichloro-4-methylaniline hydrochloride, 160 g of pyridine and 4 liters of acetonitrile and the refluxed for 3 hours. A crystallized product collected by filtration is recrystallized from chloroform to obtain the title coupler, m.p. 276°–280° C.

On the one hand, a reaction is effected on the same scale and under the same conditions as above but using I-b of the intermediate compound (I) of Synthesis Example 3 to obtain an isomer of exemplified coupler (C-5), m.p. 163°–167° C.

The couplers of the present invention, as compared with those disclosed in Japanese Laid-Open-to-Public Publication No. 20723/1975, do not bring about color fog at the time of color development, which color fog is believed to become a vital defect in color photographic materials, and have not only excellent fading-inhibition effect but also excellent Y-stain-inhibition effect. Particularly, it was no small surprise to find that the present couplers have markedly excellent fading-inhibition effects that lasts for long time.

The present couplers may be incorporated into any layers adjacent to a silver halide emulsion layer when only the fading inhibition effect is aimed at, through ordinarily the couplers are incorporated into silver halide emulsion layers of color photosensitive materials in general.

The present couplers are generally oil-soluble and, for instance, preferably they are dissolved in high boiling solvents, if necessary using low boiling solvents in combination therewith, and dispersed to prepare coupler dispersions which are then added to silver halide emulsions. In that case, hydroquinone derivatives, ultraviolet absorbers, etc. may be used in combination with the present couplers which are usable as a mixture of two or more at that time without the least inconvenience. The procedure of incorporating the present coupler into silver halide emulsions is more fully explained hereinafter. One, or two or more present couplers are dissolved, if necessary together with hydroquinone derivatives, ultraviolet absorbers, etc., in a high boiling solvent, if necessary using a low boiling solvent, to prepare a coupler solution (in this case the high boiling solvent and low boiling solvent may be used either singly or as a mixture thereof). Typical of the high boiling solvent are organic amides, carbamates, esters, ketones, urea derivatives, etc., and particularly di-n-butyl phthalate, tricresyl phosphate, triphenyl phosphate, diisooctyl azelate, di-n-butyl sebacate, tri-n-hexyl phosphate, N,N-di-ethyl-caprylamide butyl, N,N-diethyl laurylamide, n-pentadecylphenyl ether, dioctyl phthalate, n-nonyl phenol, 3-pentadecylphenyl ethyl ether, 2,5-di-sec-amylphenylbutyl ether, monophenyl-di-o-chlorophenyl phosphate or fluorinated paraffins. Typical of the low boiling solvent are methyl acetate, ethyl acetate, propyl acetate, butyl acetate, butyl propionate, cyclohexanol, diethylene glycol monoacetate, nitromethane, carbon tetrachloride, chloroform, cyclohexane tetrahydrofuran, methyl alcohol, acetonitrile, dimethylformamido, dioxane, methyl ethyl ketone, etc. The coupler solution as prepared above is mixed with an aqueous solution comprising such hydrophilic binder as gelatin, etc. and containing a surface active agent, and the mixture is emulsified with a rotary high speed mixer, a colloid mill or a supersonic wave dispersing apparatus to prepare a coupler dispersion which is then incorporated into a silver halide emulsion. Typical of the surface active agent are anion type surface active agents such as alkylbenzenesulfonic acid and alkylnaphthalenesulfonic acid and/or nonion type surface active agents such as sorbitan monolauric acid ester.

Of the couplers of the present invention, such compounds which are in a liquid state at ordinary temperatures or low in melting point may be used as solvents for oil-soluble compounds in place of a part or whole of the aforesaid high boiling solvent.

The amount of the present couplers to be used, though not critical, is preferably 10 to 100 g per mole of silver halide and may be varied if necessary.

Typical of the ultraviolet absorber used together with the present coupler are thiazolidone, benzotriazole, acrylonitrile and benzophenone type compounds. It is with advantage to use these compounds in order to prevent fading due to actinic radiation of short wavelength, and particularly is of advantage the use, either singly or in combination, of Thinubin PS, 320, 326, 327 and 328 (trade name of products produced and sold by Ciba-Geigy Co.).

Characteristic property of the present invention relates to the couplers of the present invention, which applies to any light-sensitive silver halide known hitheretofore.

Silver halide emulsions used in the color photosensitive materials are generally prepared by dispersing silver halide particles in hydrophilic colloids. The silver halide referred to herein is to designate silver chloride, silver bromide, silver iodide, silver chlorobromide, silver chloroiodobromide and mixtures thereof. These silver halides are prepared according to various procedures such as ammonia method, neutral method, the so-called conversion method and simultaneous mixing method. Usable as the hydrophilic colloids in which the above-mentioned silver halides are dispersed are generally gelatin and gelatin derivatives such as phthalated gelatin and malonated gelatin. Further, these silver halide emulsions may be optically sensitized with various sensitizing dyes in order to impart photosensitivity thereto at desired sensitive wavelength regions. Preferable sensitizing dyes are, for example, cyanine dyes, merocyanine dyes or complex cyanine dyes, and these dyes are usable either singly or in combination of two or more. Furthermore, the silver halide emulsions may be incorporated, if necessary, with various photographic additives which are usable either singly or in combination. The photographic additives may be, for example, chemical sensitizers including gold compounds, salts of noble metals such as platinum, palladium, iridium, rhodium, ruthenium, etc., sulfur compounds, reductive substances or thioether compounds, quaternary ammonium salt compounds or polyalkylene oxide compounds; stabilizers such as triazoles, imidazoles, azaindenes, benzothiazoliums, zinc compounds, cadmium compounds and mercaptans; film hardeners chromates, zirconates, mucochloric acid, aldehydes, triazines, polyepoxy compounds, active halogen compounds, ketone compounds, acryloyl, triethylenephosamide or ethyleneimine type hardeners; plasticizers including glycerine and dihydroxy alkanes such as 1,5-pentanediol; fluorescent whitening agents; antistatic agents; and coating aids. The silver halide emulsions prepared in the manner explained above are incorporated with the aforesaid dispersion having dispersed therein the present couplers and other additives, and the resulting emulsions are coated on a support, whereby a color photosensitive material is obtained. The support may be films of cellulose acetate, cellulose nitrate or such synthetic resins as polycarbonate, polyethylene phthalate and polystyrene, baryta paper, polyethylene-coated paper or glass plate, and these support may previously or suitably by provided, if necessary, with a sub layer, antihalation layer, intermediate layer, yellow filter layer or protective layer which is suitably used in combination with the silver halide emulsion layers. In the color photosensitive material according to the present invention, there may be formed not only one silver halide emulsion layer but also two or more. Furthermore, two or more silver halide emulsion layers sensitive to the same wavelength region may be formed by superposing them one upon another.

The color photosensitive materials according to the present invention are coupler-containing inner type color photosensitive materials and, after exposure, are advantageously color developed according to color development technique. The present invention is also applicable to such color photosensitive material in which the couplers and a color developing agent are made present in the same layer while protecting them so that they are not brought into contact with each other before exposure but after exposure are allowed to contact with each other, or such color photosensitive material in which a color developing agent is incorporated into a layer which does not contain couplers and upon permeation into the photosensitive material of an alkaline processing solution said color developing agent is allowed to move from the layer containing the same in a layer containing the couplers so as to contact with said couplers. In color photosensitive materials for the diffusion transfer process, the present couplers can be used by incorporating into a photosensitive element and/or an image receiving element, and it is with advantage to make the present couplers present in the photosensitive element. When applied to the reversal process, the exposed color photosensitive materials according to the present invention is first developed with a black-end-white negative developer, followed by exposure to white light or processing with a solution containing such fogging agent as a boron compound, and then color developed with an alkali developer containing a color developing agent. In that case, the fogging agent may be incorporated into the alkali developes containing the color developing agent. The present invention may also be applied to the so-called direct positive color photosensitive material in which a color positive image can be obtained by subjecting an internal latent image type silver halide emulsion to color development while fogging said emulsion with light or a fogging agent. After color development, the developed color photographic material is subjected to bleaching process with a bleaching solution containing as an oxidizing agent, ferricyanide or ferric salt of aminopolycarboxylic acid and then subjecting to fixing process with a fixing solution containing a silver salt solvent such as thiosulfate, etc., thereby removing a silver image and a residual silver halide while retaining a dye image. The developed color photosensitive material may also be subjected bleach-fixing with a monobath bleach-fixed solution in place of using the bleaching solution and fixing solution, and may further be subjected to such process as pre-hardening, neutralization, water-washing, stopping or stabilization suitably in combination with the color development, bleaching, fixing or bleach-fixing. The processing step through which particularly the color photosensitive material of the present invention may advantageously be subjected to development is, for example, such a step as comprising color development, water-washing if necessary, bleach-fixing, water-washing, stabilization if necessary, and drying, and this processing step may be may be effected at elevated temperature, for example, 30° C. or above and, morover, within a very short period of time.

Particularly useful as color developing agents used in color developing the color photosensitive materials of the present invention after exposure are primary phenylenediamines, aminophenols and derivatives thereof, for example, typical of which are those as exemplified below.

Salts with an inorganic acid such as hydrochloric or sulfuric acid or an organic acid such as p-toluenesulfonic acid of N,N-dimethyl-p-phenylenediamine, N,N-diethyl-p-phenylene-diamine, N-carbamidomethyl-N-methyl-p-phenylenediamine, N-carbaminodomethyl-N-tetrahydrofurfuryl-2-methyl-p-phenylenediamine, N-ethyl-N-carboxymethyl-2-methyl-p-phenylenediamine, N-carbamidomethyl-N-ethyl-2-methyl-p-phenylenediamine, N-ethyl-N-tetrahydrofurfuryl-2-methyl-p-aminophenol, 3-acetylamino-4-aminodimethylaniline, N-ethyl-N-$\beta$-methanesulfoneamidoethyl-4-aminoaniline, N-ethyl-N-$\beta$-methanesulfonamidoethyl-3-methyl-4-aminoaniline, N-methyl-N-$\beta$-sulfoethyl-p-phenylenediamine, o-aminophenol, p-aminophenol, and 5-amino-2-oxy-toluene.

The color developer is incorporated with such color developing agent as mentioned above and, if necessary, various other additives. Principal examples of the additive are, for example alkali agents such as hydroxide, carbonates and phosphates of alkali metals or ammonium, buffers such as acetic and boric acid, antifoggants, stain or sludge inhibitors, multi-layer effect promoters and preservatives.

The bleaching agents include ferricyanides such as potassium ferricyanide, dichromates, permanganates, hydrogen peroxide, calcium hypochloride, metal complex salts of aminopolycarboxylic acids such as ethylenediaminetetraacetic acid, nitrotriacetic acid, iminodiacetic acid, metal complex salts of polycarboxylic acids such as malonic acid, tartaric acid, maleic acid and diglycolic acid, and ferric chloride, and these bleaching agents may be used either singly or in combination if necessary. The bleaching solution containing such bleaching agent may be incorporated, if necessary, with various additives such as a bleaching assistant.

The fixing agents are thiosulfates such as sodium thiosulfate and ammonium thiosulfate, cyanides and urea derivatives, and the fixing solution containing such fixing agent may be incorporated, if necessary, with various additives such as a fixing assistant.

Color photosensitive materials comprising the couplers of the present invention may also be processed advantageously with a color developer containing both a primary aromatic amine type color developing agent and an oxidizing agent capable of subjecting a silver metal image to redox reaction, and such color photographic process involving the use of such color developer is applicable particularly effectively to the so-called silver-saving type color photosensitive material, the silver content of which is smaller than that of ordinary color photosensitive material.

The present invention is illustrated below with reference to examples, but it should be construed that embodiments of the invention are not limited to these examples.

EXAMPLE 1

The present couplers (M-4), (M-8), (M-14) and (M-23) and comparative couplers A, B and C were individually dissolved in dibutyl phthalate (DBP) and ethyl acetate (EA) in an amount as shown in Table 1-1. The solutions were individually incorporated with 100 ml of a 10% aqueous solution of sodium dialkylnaphthalenesulfonic acid (Alkanol B; produced and sold by Du Pont Co.) and 400 ml of a 5% aqueous gelatin solution and then emulsified with a colloid mill to obtain their respective coupler dispersion.

Subsequently, each sample was incorporated into 1000 ml of a green-sensitive silver chlorobromide emulsion (containing 40 mol% of silver chloride). The dispersion incorporated with 20 ml of a 1% aqueous solution of 1,2-bis(vinylsulfonyl)ethane as a hardener was coated on a polyethylenecoated paper and then dried to obtain sample No. 1-7 of a color photosensitive material.

After exposure through an optical wedge, the samples were individually processed at 30° C. according to the following steps to obtain their respective color images formed thereon.

Processing step:

Color development (3 minutes 30 seconds)→bleach-fixing (1 minute 30 seconds)→water-washing (2 minutes)→stabilization (1 minute)→drying. Each processing solution used had the following composition.

Composition of color developer:

| | |
|---|---|
| Benzyl alcohol | 5.0 ml |
| Sodium hexametaphosphate | 2.5 g |
| Anhydrous sodium sulfite | 1.9 g |
| Sodium bromide | 1.4 g |
| Borax (Na$_2$B$_4$O$_7$ . 10H$_2$O) | 39.1 g |
| N-Ethyl-N-$\beta$-methanesulfonamidoethyl-4-aminoaniline sulfate | 5.0 g |
| Water to make 1 liter and adjust to pH 10.30 with Sodium hydroxide. | |

Composition of bleach-fixing solution:

| | |
|---|---|
| Iron (II) ammonium ethylenediaminetetraacetate | 61.0 g |
| Ethylenediaminetetraacetic acid ammonium salt | 5.0 g |
| Ammonium thiosulfate | 124.5 g |
| Sodium metabisulfite | 13.3 g |
| Anhydrous sodium sulfite | 2.7 g | water to make 1 liter and adjust pH to 6.5 with ammonia water.

Composition of stabilizing solution:

Glacial acetic acid: 20 ml

Add 800 ml of water and adjust to pH 3.5-4.0 with sodium acetate, then additional water to make 1 liter.

The samples thus prepared were measured in speed, gamma, fog and maximum density respectively to obtain the results as shown in Table 1-2. Further, the samples were evaluated in stability against light by subjecting them to irradiation with a xenon fade-o-meter for 50, 100 and 300 hours respectively to obtain the results as shown in Table 1-2, wherein the dye residual ratio in terms of percentage was represented by a density as measured after irradiation by assuming as 1.0 the initial density, and the Y-stain increasing ratio in terms of percentage was represented by an increase in density in the unexposed portion (D min) after irradiation.

In Table 1-2, the film speed was represented by a relative value as measured by assuming as 100 the speed of the sample in which the comparative coupler A was used.

TABLE 1

| Sample No. | Exemplified compound | Amount (g) | DBP (g) | EA (g) |
|---|---|---|---|---|
| 1 | (M - 4) | 41.7 | 42 | 100 |
| 2 | (M - 8) | 40.3 | 40 | " |
| 3 | (M - 14) | 30.5 | 31 | " |
| 4 | (M - 23) | 25.5 | 26 | " |
| 5 | Comparative coupler A | 35.5 | 36 | " |
| 6 | Comparative coupler B | 40.0 | 40 | " |
| 7 | Comparative coupler C | 37.0 | 37 | " |

TABLE 1 - 2

| Sample No. | Speed | Fog | Gamma | Maximum density | Dye residual ratio (%) Irradiation time (hr) | | | Y-stain increasing ratio (%) Irradiation time (hr) | | |
|---|---|---|---|---|---|---|---|---|---|---|
| | | | | | 50 | 100 | 300 | 50 | 100 | 300 |
| 1 | 102 | 0.09 | 2.4 | 2.8 | 95 | 86 | 77 | 260 | 410 | 750 |
| 2 | 105 | 0.07 | 2.3 | 2.7 | 95 | 88 | 75 | 210 | 400 | 630 |
| 3 | 101 | 0.09 | 2.4 | 2.7 | 93 | 82 | 79 | 310 | 450 | 820 |
| 4 | 103 | 0.10 | 2.4 | 2.7 | 91 | 80 | 75 | 330 | 510 | 870 |
| 5 | 100 | 0.13 | 2.5 | 2.8 | 72 | 53 | 25 | 700 | 1250 | 2240 |
| 6 | 92 | 0.10 | 2.3 | 2.6 | 84 | 75 | 43 | 410 | 630 | 1380 |
| 7 | 100 | 0.12 | 2.4 | 2.8 | 79 | 62 | 29 | 490 | 870 | 1640 |

The comparative couplers used were compounds having the following structures.

Comparative coupler A:

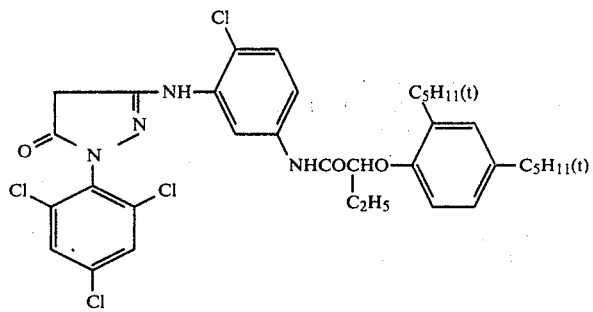

Comparative coupler B:

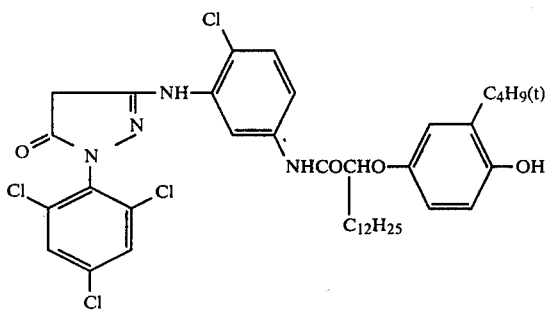

(A compound disclosed in U.S. Pat.3,519,429.)

Comparative coupler C:

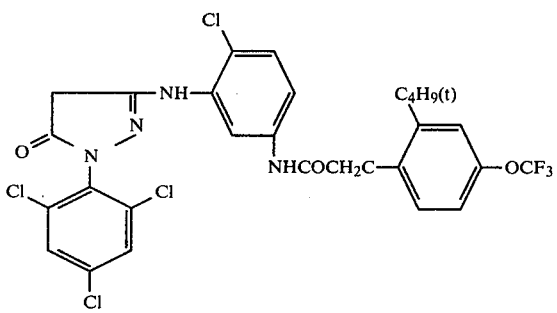

(A compound disclosed in Japanese Laid-Open to-Public Publn. No. 20726/1975.)

From the results shown in Table 1-2, it is understood that the present couplers, as compared with known couplers, have not only excellent fading inhibition and Y-stain inhibition effects but also remarkable fading inhibition effect that particularly lasts for long time.

It is quite a surprise to find that in the above-mentioned irradiation test with a xenon fade-o-meter to investigate stability against light, the present couplers demonstrate a markedly excellent fading inhibition effect even when subjected to irradiation test lasting for 300 hours as compared with the case of the known couplers.

Furthermore, the present couplers were found excellent in solubility in high boiling solvent such as DBP as well as in stability to dispersions in which they had been dispersed.

EXAMPLE 2

The present couplers (Y-2), (Y-6), (Y-10) and (Y-15) and the under-mentioned comparative couplers D and E were individually dissolved in solvents as shown in Table 2-1. After having been incorporated into 500 ml of a 5% aqueous gelatin solution containing 3.0 g of sodium dodecylbenzenesulfonate, the solutions were individually dispersed with a homogenizer to prepare dispersions. The dispersion thus obtained were individually incorporated into 1000 ml of a blue-sensitive silver chlorobromide emulsion (containing 10 mol% of silver chloride) (in this case, however, the emulsion containing each of the present couplers has the silver content being only half that of the emulsion containing each of the comparative couplers) and then charged with 10 ml of a 2% methanol solution of N,N',N''-tris(acryloyl)-hexahydro-s-traizine as a hardener. The emulsions thus prepared were individually coated on a subbed polyethylene terephthalate film and then dried to obtain samples Nos. 1 to 4 of color photosensitive material. These samples were processed according to the following processing step.

Processing step

Color development (30° C., 3 minutes 30 seconds)→stopping→first fixing→water-washing (10 minutes)→bleaching (20° C., 5 minutes)→water-washing (20° C., 5 minutes)→second fixing (20° C., 5 minutes)→water-washing (20° C., 25 minutes)→drying.

A color developer used had the same composition as in the color developer of Example 1, and stopping and first fixing were respectively effected according to the usual procedure.

Composition of bleaching solution:

| | |
|---|---|
| Potassium ferricyanide | 100 g |
| Potassium bromide | 50 g |
| Water to make | 1 liter |

Composition of fixing solution:

| | |
|---|---|
| Sodium thiosulfate pentahydrase | 250 g |
| Anhydrous sodium sulfite | 12 g |
| Potassium alum | 15 g |
| Acetic acid | 12 g |
| Water to make | 1 liter |

In order to investigate the thus obtained samples in their stability against light, they were irradiated with light from a xenon fade-o-meter for 200 hours and evaluation was made in the same manner as in Example 1 to obtain the results as shown in Table 2-2.

TABLE 2

| Sample No. | Exemplified compound | Amount (g) | TCP (g) | EA (g) |
|---|---|---|---|---|
| 1 | (Y - 2) | 87.6 | 88 | 110 |
| 2 | (Y - 6) | 73.3 | 74 | " |
| 3 | (Y - 10) | 74.0 | 74 | " |
| 4 | (Y - 15) | 66.8 | 67 | " |
| 5 | Comparative coupler D | 57 | 57 | " |
| 6 | Comparative coupler E | 67 | 67 | " |

In the above table, TCP represents tricresyl phosphate.

TABLE 2 - 2

| Sample No. | Speed | Gamma | Fog | Maximum density | Dye residual ratio(%) | Fog after irradiation |
|---|---|---|---|---|---|---|
| 1 | 105 | 1.8 | 0.30 | 2.4 | 87 | 0.15 |
| 2 | 101 | 1.8 | 0.32 | 2.5 | 88 | 0.21 |
| 3 | 100 | 1.7 | 0.30 | 2.5 | 93 | 0.10 |
| 4 | 100 | 1.8 | 0.29 | 2.4 | 85 | 0.15 |
| 5 | 100 | 1.8 | 0.40 | 2.3 | 78 | 0.35 |
| 6 | 110 | 1.8 | 0.41 | 2.4 | 31 | 0.40 |

In Table 2-2, the speed was represented by a relative value as measured by assuming as 100 the speed of the sample containing the comparative coupler D.

The comparative couplers used were compounds having the following structures.

Comparative coupler D

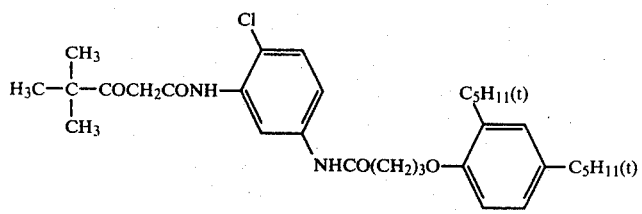

(A compound disclosed in U.S.P. 3,265,506.)

Comparative coupler E

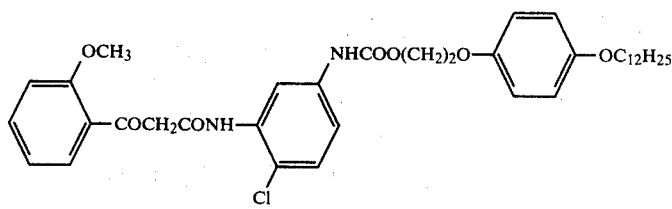

(A compound disclosed in Japanese Laid-Open-to-Public Publn. No. 20723/1975.)

From the results shown in Table 2-2, it is understood that as compared with the prior art couplers, the present couplers are excellent in stability against light and, at the same time, the samples containing the present couplers are less in initial fog and not degradated in photographic properties and the dispersions of the present couplers as obtained are excellent in stability.

EXAMPLE 3

The present couplers (C-2), (C-4) and (C-5) and comparative couplers F, G, H and I were individually dissolved in solvents in the manner as shown in Table 3-1. The solutions were individually incorporated into 500 ml of a 5% aqueous gelatin solution containing dodecylbenzenesulfonate, and the mixtures were individually dispersed with a homogenizer to prepare dispersions. The dispersions thus obtained were individually incorporated into 1000 ml of a red-sensitive silver chlorobromide (containing 20 mol% of silver chloride) emulsion. The emulsions thus prepared were individually charged with 20 ml of a 4% aqueous solution of 2,4-dichloro-6-hydroxy-s-triazine sodium as a hardener, coated on a subbed triacetylacetate film and dried to obtain samples Nos. 1–7 of color photosensitive material.

These samples were processed according to the same procedure as in Example 1 and then measured in the same manner as in Example 2 to obtain the results as shown in Table 3-2.

TABLE 3 - 1

| Sample No. | Exemplified compound | Amount added (g) | TCP (g) | EA (g) |
|---|---|---|---|---|
| 1 | (C - 2) | 62 | 62 | 120 |
| 2 | (C - 4) | 57.5 | 58 | " |
| 3 | (C - 5) | 40 | 40 | " |
| 4 | Comparative coupler F | 47.5 | 46 | " |
| 5 | Comparative coupler G | 52 | 52 | " |
| 6 | Comparative coupler H | 49 | 49 | " |
| 7 | Comparative coupler I | 57 | 57 | " |

TABLE 3 - 2

| Sample No. | Speed | Gamma | Fog | Maximum density | Dye residual ratio (%) | Y-stain increasing ratio (%) |
|---|---|---|---|---|---|---|
| 1 | 105 | 1.8 | 0.05 | 2.2 | 92 | 150 |

TABLE 3 - 2-continued

| Sample No. | Speed | Gamma | Fog | Maximum density | Dye residual ratio (%) | Y-stain increasing ratio (%) |
|---|---|---|---|---|---|---|
| 2 | 110 | 1.2 | 0.07 | 2.0 | 95 | 130 |
| 3 | 110 | 1.9 | 0.06 | 2.1 | 93 | 155 |
| 4 | 100 | 1.1 | 0.13 | 2.0 | 89 | 230 |
| 5 | 105 | 1.1 | 0.15 | 2.0 | 90 | 200 |
| 6 | 100 | 1.8 | 0.10 | 2.4 | 83 | 180 |
| 7 | 103 | 1.7 | 0.08 | 2.4 | 87 | 175 |

In the above table, the speed was represented by a relative value as measured by assuming as 100 the speed of sample No. 4 as well as of sample No. 6.

The comparative couplers used were compounds having the following structures.

Comparative coupler F

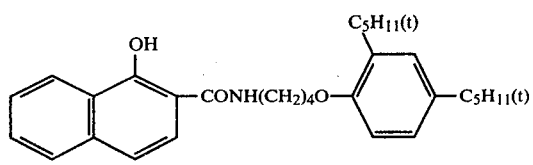

Comparative coupler G

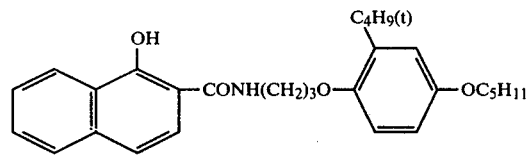

(A compound disclosed in Japanese Laid-Open-to-Public Publn. No. 20723/1975.)

Comparative coupler H

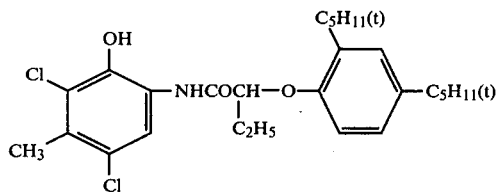

Comparative coupler I

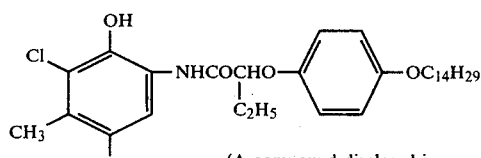

(A compound disclosed in Japanese Laid-Open-to-Public Publn. No. 20723/1975.)

From the results shown in Table 3-2, it is understood that as compared with the prior art coupler, the present couplers are excellent in stability against light as well as less in Y-stain increasing ratio, and that the present couplers are excellently soluble in high boiling solvents such as TCP and the dispersions containing the present couplers as prepared are found stable.

EXAMPLE 4

On a polyethylene-coated paper support were successively coated from the support surface side the undermentioned layers to prepare a sample of color photosensitive material. (Sample No. 1)

In that case, the support was prepared in the following manner; A white pigment prepared according to the procedure described in Japanese Laid-Open-to-Public Publn. No. 6531/1976 and comprising 85 parts by weight of anatase type titanium oxide surface-treated with 3% by weight of hydrous alumina and 15 parts by weight of rutile type titanium oxide and a blueing agent was mixed with 100 parts by weight of polyethylene of an average molecular weight of 80,000 and a density of 0.95 and 15 parts by weight of polyethylene of an average molecular weight of 4,000 and a density of 0.93 (the white pigment and the blueing agent were used so that said pigment became 8% by weight based on the combined polyethylene and said agent came to have an average reflection of 78% at a wavelength of from 570 nm to 660 nm), and the mixture was coated according to extrusion coating method on paper of fine quality weighing 150 g/m² to form a coating of a thickness of 0.031 mm. On the reverse side of the support was formed a coating having a film thickness of 0.038 mm and comprising polyethylene only.

First layer: A blue-sensitive silver halide emulsion layer comprising a silver chlorobromide emulsion containing 10 mol% silver chloride, said emulsion containing 400 g of gelatin per mole of silver halide, being sensitized with $2.5 \times 10^{-4}$ mole, per mole of silver halide, of a sensitizing dye of the following structure, containing $1 \times 10^{-1}$ mole, per mole of silver halide, of the present yellow coupler (Y-10) dispersed in DBP, and being coated so that the amount of silver becomes 400 mg/m².

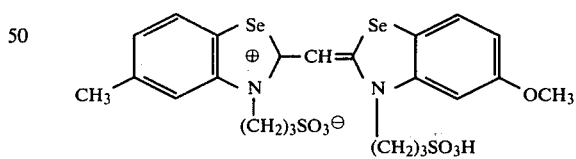

Second layer: A gelatin layer being coated so as to have a dry film thickness of 1μ.

Third layer: A green-sensitive silver halide emulsion layer comprising a silver chlorobromide emulsion containing 40 mol% of silver chloride, said emulsion containing 500 g of gelatin per mole of silver halide, being sensitized with $2.5 \times 10^{-4}$ mole, per mole of silver halide, of a sensitizing dye of the following structure, containing $1 \times 10^{-1}$ mole, per mole of silver halide, of the present magenta coupler (M-8) dissolved in TCP, and being coated so that the amount of silver becomes 500 mg/m².

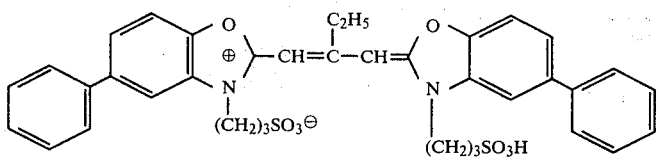

Fourth layer: A gelatin layer of a dry film thickness of 1μ containing 30 mg/m² of di-t-octylhydroquinone dissolved in DBP and 0.7 g/m² of 2-(2'-hydroxy-3',5'-di-t-butylphenyl)-benztriazole.

Fifth layer: A red-sensitive silver halide emulsion layer conprising a silver chlorobromide emulsion containing 20 mol% of silver chloride, said emulsion containing 500 g of gelatin per mole of silver halide, being sensitized with $2.5 \times 10^{-4}$ mole, per mole of silver halide, of a sensitizing dye of the following structure, containing $1 \times 10^{-1}$ mole, per mole of silver halide, of the present cyan coupler (C-2) dispersed in TCP, and being coated so that the amount of silver becomes 500 mg/m².

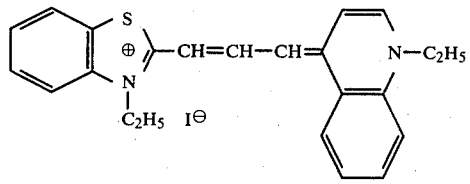

Sixth layer: A gelatin layer being coated so as to have a dry film thickness of 1μ.

The silver halide emulsion used in each of the above-mentioned photosensitive layers was prepared according to the procedure described in Japanese Patent Publn. No. 7772/1971, chemically sensitized with sodium thiosulfate pentahydrate and incorporated with 4-hydroxy-6-methyl-1,3,3a,7-tetrazaindene as a stabilizer, tetrakis-(vinylsulfonylmethyl)methane as a hardener and saponin as a coating aid.

Subsequently, sample No. 2 was prepared in the same procedure as in the sample No. 1 above except that a known coupler of the following structure was used in place of the present coupler in the first layer, the comparative coupler C used in Example 1 was used in place of the present coupler in the third layer, and the comparative coupler H used in Example 3 was used in place of the present coupler in the fifth layer, the amount of each coupler used in the sample No. 2 being double the molar quantity of the present coupler.

red light respectively, and the exposed samples were processed according to the same procedure as in Example 1. Thereafter, the processed samples were subjected to irradiation with a xenon fade-o-meter for 200 hours to measure the residual ratio and Y-stain increasing ratio thereof, both definitions of which being the same as in Table 1-2 of Example 1. The results obtained were as shown in Table 4.

TABLE 4

| Sample | Dye residual ratio (%) | | | Y-stain increasing |
| No. | Yellow | Magenta | Cyan | ratio (%) |
|---|---|---|---|---|
| 1 | 93 | 94 | 98 | 130 |
| 2 | 89 | 78 | 96 | 315 |

From the results shown in Table 4, it is understood that the sample No. 1 containing the present couplers has markedly excellent fading inhibition and Y-stain inhibition effects, as compared with the sample No. 2 containing the prior art couplers.

EXAMPLE 5

The present couplers (M-4), (M-8) and (M-14) and comparative couplers A and C were individually dissolved in DBP and EA in the manner as shown in Table 5-1, followed by addition of 120 ml of a 5% aqueous gelatin solution containing sodium dodecylbenzenesulfonate, and the solutions were individually treated with a homogenizer to prepare their respective dispersions. The dispersions were individually incorporated into 300 ml of a green-sensitive silver chlorobromide (containing 30 mol% of silver halide), and the emulsions were individually coated on a polyethylene-coated paper and then dried to obtain samples of light-sensitive silver halide photographic material.

The sample thus obtained were exposed to light through an optical wedge according to sensitometry method and then processed at a temperature of 24° C. in the following order.

Processing step:

| | |
|---|---|
| First development | 5 minutes |

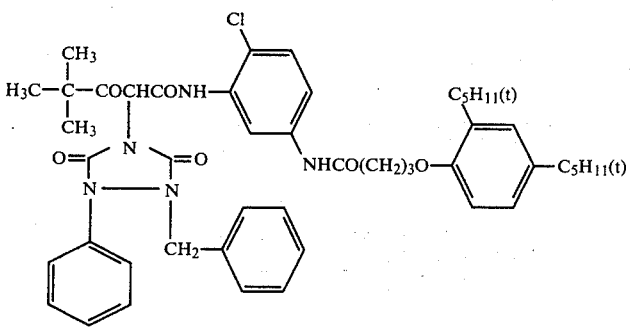

The samples thus prepared were individually exposed through an optical wedge to blue light, green light and -continued

| | |
|---|---|
| Water-washing | 4 minutes |
| Exposure | |
| Color development | 3 minutes |
| Water-washing | 4 minutes |
| Bleaching | 4 minutes |
| Fixing | 4 minutes |
| Water-washing | 10 minutes |

The developer, color developer, bleaching solution and fixing solution used were the following processing solutions, respectively.

Composition of first developer:

| | |
|---|---|
| Anhydrous sodium bisulfite | 8.0 g |
| Phenidon | 0.35 g |
| Anhydrous sodium sulfite | 37.0 g |
| Hydroquinone | 5.5 g |
| Anhydrous sodium carbonate | 28.2 g |
| Sodium thiocyanide | 1.38 g |
| Anhydrous sodium bromide | 1.30 g |
| Potassium iodide (0.1% aqueous solution) | 13.0 ml |
| Water to make 1 liter (pH 9.9) | |

Composition of color developer:

| | |
|---|---|
| Benzyl alcohol | 5.0 ml |
| Sodium methanoate | 2.5 g |
| Anhydrous sodium sulfite | 1.9 g |
| Sodium bromide | 1.4 g |
| Potassium bromide | 0.5 g |
| Borax (Na₂B₄O₇ . 10 H₂O) | 39.1 g |
| N-ethyl-Nβ-methansulfonamidoethyl-4-amino-3-methylaniline sulfate | 5.0 g |

Water to make 1 liter and adjust to pH 10.30 with sodium hydroxide.

Composition of bleaching solution:

| | |
|---|---|
| Anhydrous sodium bromide | 43.0 g |
| Potassium ferricyanide | 165.0 g |
| Borax (Na₂B₄O₇ . 10 H₂O) | 1.2 g |
| Water to make 1 liter. | |

Composition of fixing solution:

| | |
|---|---|
| Sodium thiosulfate (pentahydrate) | 200 g |
| Anhydrous sodium sulfate | 100 g |
| Anhydrous sodium hydrogenphosphate | 15 g |
| Water to make 1 liter. | |

The samples thus processed were subjected to irradiation with light from a fade-o-meter for 200 hours in order to investigate light fastness. Thereafter, the measurement was conducted in the same manner as in Example 1 to obtain the results as shown in Table 5-2.

TABLE 5 - 1

| Sample No. | Exemplified compound | Amount added (g) | DBP (g) | EA (g) |
|---|---|---|---|---|
| 1 | (M - 4) | 21 | 21 | 50 |
| 2 | (M - 8) | 20 | 20 | " |
| 3 | (M - 14) | 15 | 15 | " |
| 4 | Comparative coupler A | 18 | 18 | " |
| 5 | Comparative coupler C | 18 | 18 | " |

TABLE 5 - 2

| Sample No. | Maximum density | Minimum density | Dye residual ratio (%) | Y-stain increasing ratio (%) |
|---|---|---|---|---|
| 1 | 2.8 | 0.09 | 86 | 400 |
| 2 | 2.7 | 0.09 | 83 | 420 |
| 3 | 2.8 | 0.10 | 85 | 410 |
| 4 | 2.8 | 0.11 | 49 | 1350 |
| 5 | 2.7 | 0.12 | 52 | 1100 |

From the results shown in Table 5-2, it is understood that favorable color reversal images are obtained by the use of the present couplers which are found to have excellent fading inhibition and Y-stain inhibition effects as compared with the known couplers. Further, the present couplers were excellently soluble in high boiling solvents such as DBP and dispersions thereof were also found excellently stable.

EXAMPLE 6

Solutions obtained respectively by dissolving the present couplers (M4), (M-8) and (M-14) and comparative couplers A and B in DBP and EA in the manner as shown in Table 6-1 were individually incorporated into 500 ml of a 5% aqueous gelatin solution containing sodium dodecylbenzenesulfonate and then emulsified to prepare their respective dispersions.

Subsequently, these emulsified dispersion were individually incorporated into 1 liter of an internal latent image type silver chloroiodobromide emulsion (containing 0.35 mol% of silver chloroiodobromide) prepared according to a process disclosed in U.S. Pat. No. 2,592,250, followed by addition of 25 ml of a 5% acetone solution of tetrakis(vinylsulfonylmethyl)methane as a hardener. The emulsions were then individually coated on a cellulose triacetate support so that the coated amount of silver became 20 mg/100 cm², whereby samples Nos. 1–5 were obtained.

After wedgewise exposure, the samples were developed at 20° C. for 5 minutes with a developer of the following composition, followed by bleaching, fixing and water-washing in the same procedure as in Example 1, and then dried. The samples thus processed were irradiated for 200 hours with light from a xenon fade-o-meter in order to investigate light fastness. Thereafter, the samples thus treated were measured in the same way as in Example 1 to obtain the results as shown in Table 6-2.

Composition of developer:

| | |
|---|---|
| 4-Amino-3-methyl-N-ethyl-N-(β-hydroxyethyl)aniline sulfate | 5 g |
| Sodium sulfate (anhydrous) | 2 g |
| Trisodium phosphate | 40 g |
| Benzimidazole | 50 ml |
| 1-Acetyl-2-phenylhydrazine | 1 g |
| Water to make | 1 liter |
| (Adjusted to pH 12.0 with sodium hydroxide | |

TABLE 6 - 1

| Sample No. | Exemplified compound | Amount added (g) | DBP (g) | EA (g) |
|---|---|---|---|---|
| 1 | (M - 8) | 40 | 40 | 100 |
| 2 | (M - 14) | 30 | 30 | " |
| 3 | (M - 4) | 42 | 42 | " |
| 4 | Comparative coupler A | 36 | 36 | " |
| | Comparative | | | |

TABLE 6 - 1-continued

| Sample No. | Exemplified compound | Amount added (g) | DBP (g) | EA (g) |
|---|---|---|---|---|
| 5 | coupler C | 37 | 37 | " |

TABLE 6 - 2

| Sample No. | Maximum density | Minimum density | Dye residual ratio (%) | Y-stain increasing ratio (%) |
|---|---|---|---|---|
| 1 | 2.8 | 0.10 | 85 | 410 |
| 2 | 2.7 | 0.09 | 80 | 460 |
| 3 | 2.8 | 0.09 | 86 | 420 |
| 4 | 2.7 | 0.11 | 51 | 1300 |
| 5 | 2.8 | 0.13 | 55 | 1050 |

From the results shown in Table 6-2, it is understood that favorable color positive images are obtained by the use of the present couplers, and further that as compared with the known couplers, the present couplers have excellent fading inhibition and Y-stain inhibition effects. The present couplers were found excellent in solubility in high boiling solvents such as DBP as well as in stability to the dispersions in which they had been dispersed.

EXAMPLE 7

The samples Nos. 1, 2, 3 and 4 and comparative samples A, B and C as prepared in Example 1 were processed according to the under-mentioned processing step.

Processing step:

| | Temperature | Time |
|---|---|---|
| Color development | 33° C. | 3' 30" |
| Bleach-fixing | 33° C. | 1' 30" |
| Water-washing | 33° C. | 3' 30" |
| Drying | 30–120° C. | |

Color developer:

| | | |
|---|---|---|
| (Portion A) | Benzyl alcohol | 15 ml |
| | Ethylene glycol | 15 ml |
| | Whitex BB* (50% solution) | |
| | (*a trade name of fluorescent whitening agent produced and sold by Sumitomo Chemical Co.) | |
| (Portion B) | Hydroxylamine hydrochloride | 3 g |
| (Portion C) | 3-Methyl-4-amino-N-ethyl-N-(β-methanesulfonamidoethyl)-aniline sulfate | 4.5 g |
| | p-Toluenesulfonic acid | 10.0 g |
| (Portion D) | Water | 70 ml |
| | $K_2CO_3$ | 30 g |
| | $K_2SO_3$ | 2 g |
| | KBr | 0.5 g |
| | KCl | 0.5 g |
| | 1-Hydroxyethylidene-1,1-diphosphonic acid (60% aq. solution) | 2 ml |

The above-mentioned portions A, B, C and D were successively dissolved in water to make up them into a solution of a total volume of 1000 ml and adjusted to pH 10.2 with a sulfuric acid solution or potassium hydroxide solution.

Bleach-fixing solution:

| | | |
|---|---|---|
| (Portion A) | Water | 50 ml |
| | Ethylenediaminetetraacetic acid | 40 g |
| | Ammonium sulfite (40% solution) | 35 ml |
| | Ammonium thiosulfate (70% solution) | 135 ml |
| | Ammonia water (28%) | 35 ml |
| (Portion B) | Iron (III) sodium ethylenediaminetertaacetate | 70 g |

The above-mentioned portions A and B were successively dissolved in water to make up them into a solution of a total volume of 1000 ml and adjusted to pH 7 with ammonia water or glacial acetic acid.

It has been found that as compared with the comparative samples, the samples according to the present invention demonstrated excellent light fastness even when processed with the above-mentioned processing solutions.

EXAMPLE 8

The same color developer as used in Example 4 was prepared but using as a color developing agent a mixture of the following compounds in the proportion of 2:3 and in an amount necessary for obtaining gamma obtained in Example 4.

. N,N-Diethyl-2-methyl-p-phenylenediamine p-toluenesulfonate,

. N-Ethyl-n-carboxyethyl-2-methyl-p-phenylenediamine p-toluenesulfonate,

. N-Ethyl-N-hydroxyethyl-2-methyl-p-phenylenediamine sulfate and

. N,N-Diethyl-2-methyl-p-phenylenediamine p-toluenesulfonate, respectively, with 3-Methyl-4-amino-N-ethyl-N-(β-methanesulfonamidoethyl)aniline sulfate.

The samples prepared in Example 4 were exposed in the same manner as in Example 1 and then processed with each of the color developers prepared above, followed by irradiation for 300 hours with a xenon fade-ometer. As the result, it has been found that as compared with the comparative samples, the present samples were excellent in light fastness.

What we claimed is:

1. A color photographic material comprising a support and light-sensitive silver halide emulsion layer thereon, characterized by containing a coupler represented by the following general formula [I];

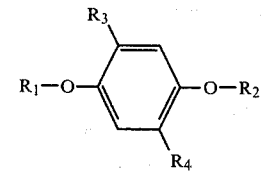

wherein $R_1$, $R_2$, $R_3$ and $R_4$ individually represent a substituted or unsubstituted alkyl, alkenyl, aryl or cycloalkyl group, or $-[A(X)_n]_m Cp$ in which Cp represents a cyano coupler, magenta coupler or yellow coupler, A represents a substituted or unsubstituted divalent aliphatic group, X represents a divalent group, and m and n individually represent a value of 0 or 1, provided that at least one of $R_1$, $R_2$, $R_3$ and $R_4$ is $-[A(X)_n]_m Cp$.

2. A color photographic material according to claim 1 wherein the Cp is linked to a non-coupling position.

3. A color photographic material according to claim 1, wherein the Cp represents a magenta coupler represented by the following general formula [II-a] or [II-b]:

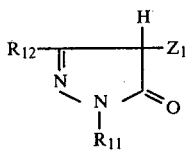
General formula [II-a]

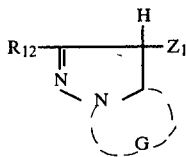
General formula [II-b]

wherein $R_{11}$ and $R_{12}$ individually represents a group selected from a group consisting of an alkyl, alkenyl, cycloalkyl, terpenyl, aryl, heterocyclic which is 5 or 6 membered and containing a nitrogen, oxygen or sulfur atom, ester, oxy, thio, carboxy, amino, amido, acylamine, ureido, thioureido, carbamoyl, thiocarbamoyl, guanidino or sulfamoyl group; $Z_1$ represents a hydrogen atom or a split off group; a represents a heterocyclic ring selected from a triazole, imidazole or benzimidazole; and provided that at least one of $R_{11}$, $R_{12}$, G and $Z_1$ is substituted by $\{A(X)_n\}_m$, or at least one of $R_{11}$, $R_{12}$ and $Z_1$ is a group represented by $\{A(X)_n\}_m$.

4. A color photographic material according to claim 1 wherein the Cp represents a magenta coupler represented by the following general formula [II']:

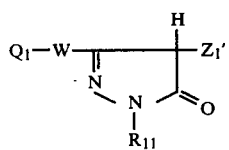
General formula [II']

wherein $R_{11}$ and $Q_1$ individually represent a group selected from a group consisting of an alkyl, alkenyl, cycloalkyl, terpenyl, aryl, heterocyclic which is 5 or 6 membered and containing a nitrogen, oxygen or sulfur atom, ester, oxy, thio, carboxy, amino, amido, acylamine, ureido, thioureido, carbamoyl, thiocarbamoyl, guanidino or sulfamoyl group; $Z_1$ represents a hydrogen atom or a split-off group;

W is

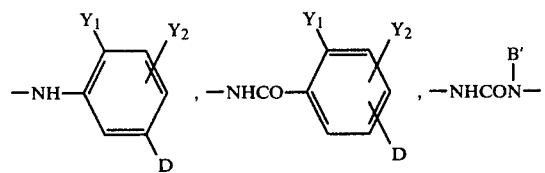

or —NHCO, in which formulas $Y_1$ and $Y_2$ individually represent a hydrogen or halogen atom, or an alkyl or alkoxy group, B' is a hydrogen atom or an alkyl group, and D is —NHCO—, —CONH—, —NHSO$_2$—, —SO$_2$NH—,

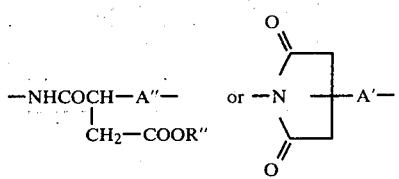

in which A' and A" individually represent a simple bond, —O—, —S—, —SO$_2$— or —NR'—, R' is a hydrogen atom, or an alkyl, aryl or acyl group and R" is an alkyl group; and provided that at least one of $Q_1$, $R_{11}$ and $Z_1'$ is substituted by $\{A(X)_n\}_m$.

5. A color photographic material according to claim 4 wherein $Q_1$ in the formula [II'] is substituted by $\{A(X)_n\}_m$.

6. A color photographic material according to claim 1 wherein the Cp represents a yellow coupler represented by the following general formula [III]:

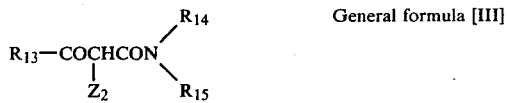
General formula [III]

wherein $R_{13}$ represents an alkyl group, an aryl group or a 5 or 6 membered heterocyclic group containing an oxygen, nitrogen or sulfur atom; $R_{14}$ and $R_{15}$ individually represent a hydrogen atom, an alkyl group or an aryl group; $Z_2$ is a hydrogen, halogen atom or a group being capable of split-off; provided that at least one of $R_{13}$, $R_{14}$, $R_{15}$ and $Z_2$ is a group substituted by $\{A(X)_n\}_m$.

7. A color photographic material according to claim 1 wherein the Cp represents a cyan coupler represented by the following general formula [IV], [V] or [VI];

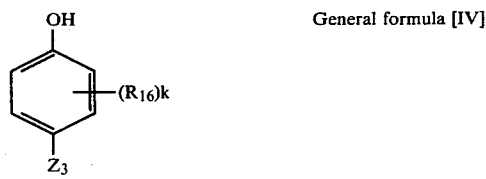
General formula [IV]

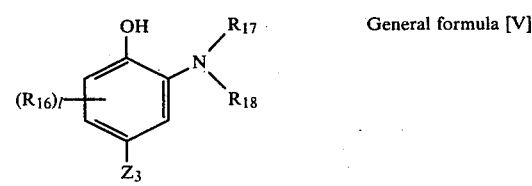
General formula [V]

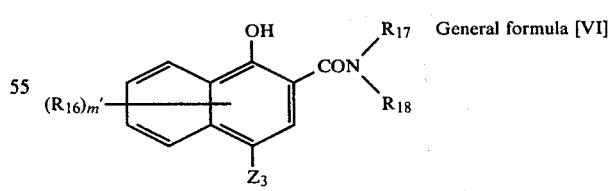
General formula [VI]

wherein $R_{16}$, $R_{17}$ and $R_{18}$ individually represent a group used in an ordinary 4-equivalent type phenol or α-naphthol coupler; k is an integer of 1 to 4; l is an integer of 0 to 3; halogen atom or a split-off group; and provide that at least one of $R_{16}$, $R_{17}$, $R_{18}$ and $Z_3$ is substituted by $\{A(X)_n\}_m$ or represented by $\{A(X)_n\}_m$.

* * * * *